US012635341B2

(12) United States Patent
Jeong et al.

(10) Patent No.: US 12,635,341 B2
(45) Date of Patent: May 19, 2026

(54) THIN FILM TRANSISTOR AND DISPLAY PANEL INCLUDING THE SAME

(71) Applicant: LG Display Co., Ltd., Seoul (KR)

(72) Inventors: Mijin Jeong, Paju-si (KR); Sangsoon Noh, Paju-si (KR); Dongchae Shin, Paju-si (KR); Sunyoung Choi, Paju-si (KR); Moonho Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 350 days.

(21) Appl. No.: 18/213,047

(22) Filed: Jun. 22, 2023

(65) Prior Publication Data

US 2024/0107805 A1 Mar. 28, 2024

(30) Foreign Application Priority Data

Sep. 26, 2022 (KR) ........................ 10-2022-0121516

(51) Int. Cl.
| | |
|---|---|
| *H01L 27/12* | (2006.01) |
| *H10D 86/40* | (2025.01) |
| *H10D 86/60* | (2025.01) |
| *H10K 59/121* | (2023.01) |

(52) U.S. Cl.
CPC ....... *H10K 59/1213* (2023.02); *H10D 86/421* (2025.01); *H10D 86/60* (2025.01)

(58) Field of Classification Search
CPC .............. H10D 30/6734; H10D 30/67; H10D 30/6755; H10D 86/421; H10D 86/40; H10D 86/60; H10D 86/0221; H10D 86/01; H10D 86/423; H10D 86/431; H10D 86/481; H10K 59/1213; H10K 59/121; H10K 59/124
See application file for complete search history.

(56) References Cited

U.S. PATENT DOCUMENTS

| | | | |
|---|---|---|---|
| 10,290,658 B2 * | 5/2019 | Koo ................... | H10D 86/0221 |
| 2016/0012775 A1 | 1/2016 | Jeong et al. | |
| 2018/0175077 A1 * | 6/2018 | Koo ..................... | H10D 86/471 |
| 2021/0104558 A1 | 4/2021 | Kim et al. | |

FOREIGN PATENT DOCUMENTS

| | | |
|---|---|---|
| KR | 10-0807556 B1 | 2/2008 |
| KR | 10-2016-0007982 A | 1/2016 |
| KR | 10-2021-0041150 A | 4/2021 |

OTHER PUBLICATIONS

Ministry of Intellectual Property of Korea, Office Action, Korean Patent Application No. 10-2022-0121516, Feb. 19, 2026, 19 pages.

* cited by examiner

*Primary Examiner* — Nikolay K Yushin
(74) *Attorney, Agent, or Firm* — Fenwick & West LLP

(57) ABSTRACT

The present disclosure relates to an organic light emitting display device, and more particularly, to a thin film transistor using an oxide semiconductor material for a plurality of thin film transistors constituting a circuit portion of a sub-pixel and a display panel including the thin film transistor. The plurality of thin film transistors includes a plurality of switching transistors and a driving transistor. Each of the plurality of switching transistors has a first dose, and the driving transistor has a second dose different from the first dose.

16 Claims, 16 Drawing Sheets

THIN FILM TRANSISTOR AND DISPLAY PANEL INCLUDING THE SAME

CROSS REFERENCE TO RELATED APPLICATION

The present application claims the benefit under 35 USC § 119(a) of Republic of Korea Patent Application No. 10-2022-0121516, filed Sep. 26, 2022, in the Korean Intellectual Property Office, the contents of which are incorporated herein by reference in their entirety.

TECHNICAL FIELD

The present disclosure relates to an organic light emitting display device, and more particularly, to a thin film transistor using an oxide semiconductor material for a plurality of thin film transistors constituting a circuit portion of a sub-pixel and a display panel including the thin film transistor.

BACKGROUND

Organic light emitting display devices use self-emitting light emitting elements instead of using a back-light unlike liquid crystal displays and thus, are becoming the mainstream in the display field due to their excellent thin film properties and image quality.

A plurality of transistors is disposed in a sub-pixel of the light emitting display device. The transistors may include a driving transistor and a plurality of switching transistors. For the transistors, an oxide semiconductor or a polycrystalline semiconductor may be used as an active layer. The driving transistor and the switching transistor have different device performance requirements. For example, the driving transistor and the switching transistor are different from each other in required threshold voltage, on current, off current, and charge mobility.

In order to secure the different device performance required for each type of transistor as described above, a so-called hybrid type sub-pixel using different semiconductor layers may be implemented. However, the number of manufacturing processes required to form different semiconductor layers is increasing, resulting in higher manufacturing costs and process times.

SUMMARY

The present disclosure has been made to solve the above-mentioned problems occurring in the prior art and an object of the present disclosure is to unify the types of transistors included in a sub-pixel to fabricate transistors with an oxide semiconductor.

In addition, an object of the present disclosure is to secure all device performances required for a driving transistor and a switching transistor, even though transistors are unified with an oxide semiconductor.

According to one embodiment, a display panel includes a plurality of switching transistors, each including a first semiconductor pattern including an oxide semiconductor and having a first dose and a first gate electrode, and a driving transistor including a second semiconductor pattern including the oxide semiconductor and having a second dose different from the first dose and a second gate electrode.

The second dose may be larger than the first dose.

A first distance between the first semiconductor pattern and the first gate electrode may be different from a second distance between the second semiconductor pattern and the second gate electrode.

The first distance may be larger than the second distance.

The first semiconductor pattern and the second semiconductor pattern may be formed in the same layer as each other, the first gate electrode and the second gate electrode may be formed in the same layer as each other. The display panel may further include a gate insulating layer disposed on the first and second semiconductor patterns.

A height of the gate insulating layer at the switching transistor may be higher than a height of the gate insulating layer at the driving transistor.

The display panel may further include an auxiliary interlayer insulating layer disposed between the first semiconductor pattern and the first gate electrode.

The first gate electrode and a channel region of the first semiconductor pattern may have the same width as each other.

The second gate electrode and a channel region of the second semiconductor pattern may have the same width as each other.

The first gate electrode and the second gate electrode may have the same width as each other.

A channel region of the first semiconductor pattern and a channel region of the second semiconductor pattern may have the same width as each other.

A first distance between the first semiconductor pattern and the first gate electrode may be equal to a second distance between the second semiconductor pattern and the second gate electrode.

The first gate electrode and a channel region of the first semiconductor pattern may have the same width as each other, the second gate electrode and a channel region of the second semiconductor pattern may have the same width as each other, the first gate electrode and the second gate electrode may have the same width as each other, and the channel region of the first semiconductor pattern and the channel region of the second semiconductor pattern may have the same width as each other.

According to one embodiment, a display panel includes a plurality of switching transistors each including a first semiconductor pattern including an oxide semiconductor and having a first total dose and a first gate electrode, and a driving transistor including a second semiconductor pattern including the oxide semiconductor and having a second total dose different from the first total dose and a second gate electrode.

A width of the first gate electrode may be larger than a width of the second gate electrode.

A width of a channel region of the first semiconductor pattern may be larger than a width of a channel region of the second semiconductor pattern.

A width of the first gate electrode may be equal to a width of the second gate electrode, a width of a channel region of the first semiconductor pattern may be larger than a width of a channel region of the second semiconductor, and the width of the channel region of the second semiconductor pattern may be equal to the width of the second gate electrode.

A width of the first gate electrode may be equal to a width of the second gate electrode, a width of a channel region of the first semiconductor pattern may be larger than a width of a channel region of the second semiconductor, and the width of the channel region of the first semiconductor pattern may be larger than the width of the first gate electrode.

According to one embodiment, a display panel includes a plurality of switching transistors each including a first semiconductor pattern including an oxide semiconductor and having a first dose and a first gate electrode, and a driving transistor including a second semiconductor pattern

3 including the oxide semiconductor and having a second dose different from the first dose and a second gate electrode.

The second dose may be larger than the first dose.

A first distance between the first semiconductor pattern and the first gate electrode may be different from a second distance between the second semiconductor pattern and the second gate electrode.

The first distance may be larger than the second distance.

The first semiconductor pattern and the second semiconductor pattern may be formed in the same layer as each other. The first gate electrode and the second gate electrode may be formed in the same layer as each other. The display panel may further include a gate insulating layer disposed on the first and second semiconductor patterns.

A height of the gate insulating layer at the switching transistor may be higher than a height of the gate insulating layer at the driving transistor.

The display panel may further include an auxiliary interlayer insulating layer disposed between the first semiconductor pattern and the first gate electrode.

The first gate electrode and a channel region of the first semiconductor pattern may have the same width as each other.

The second gate electrode and a channel region of the second semiconductor pattern may have the same width as each other.

The first gate electrode and the second gate electrode may have the same width as each other.

According to one embodiment, a channel region of the first semiconductor pattern and a channel region of the second semiconductor pattern may have the same width as each other.

A first distance between the first semiconductor pattern and the first gate electrode may be equal to a second distance between the second semiconductor pattern and the second gate electrode.

The first gate electrode and a channel region of the first semiconductor pattern may have the same width as each other, the second gate electrode and a channel region of the second semiconductor pattern may have the same width as each other, the first gate electrode and the second gate electrode may have the same width as each other, and the channel region of the first semiconductor pattern and the channel region of the second semiconductor pattern may have the same width as each other.

A display panel includes a plurality of switching transistors, each including a first semiconductor pattern including an oxide semiconductor and having a first total dose and a first gate electrode, and a driving transistor including a second semiconductor pattern including the oxide semiconductor and having a second total dose different from the first total dose and a second gate electrode.

A width of the first gate electrode may be larger than a width of the second gate electrode.

A width of a channel region of the first semiconductor pattern may be larger than a width of a channel region of the second semiconductor pattern.

A width of the first gate electrode may be equal to a width of the second gate electrode, a width of a channel region of the first semiconductor pattern may be larger than a width of a channel region of the second semiconductor, and the width of the channel region of the second semiconductor pattern may be equal to the width of the second gate electrode.

A width of the first gate electrode may be equal to a width of the second gate electrode, a width of a channel region of the first semiconductor pattern may be larger than a width of a channel region of the second semiconductor, and the width of the channel region of the first semiconductor pattern may be larger than the width of the first gate electrode.

DETAILED DESCRIPTION

Figure 1:
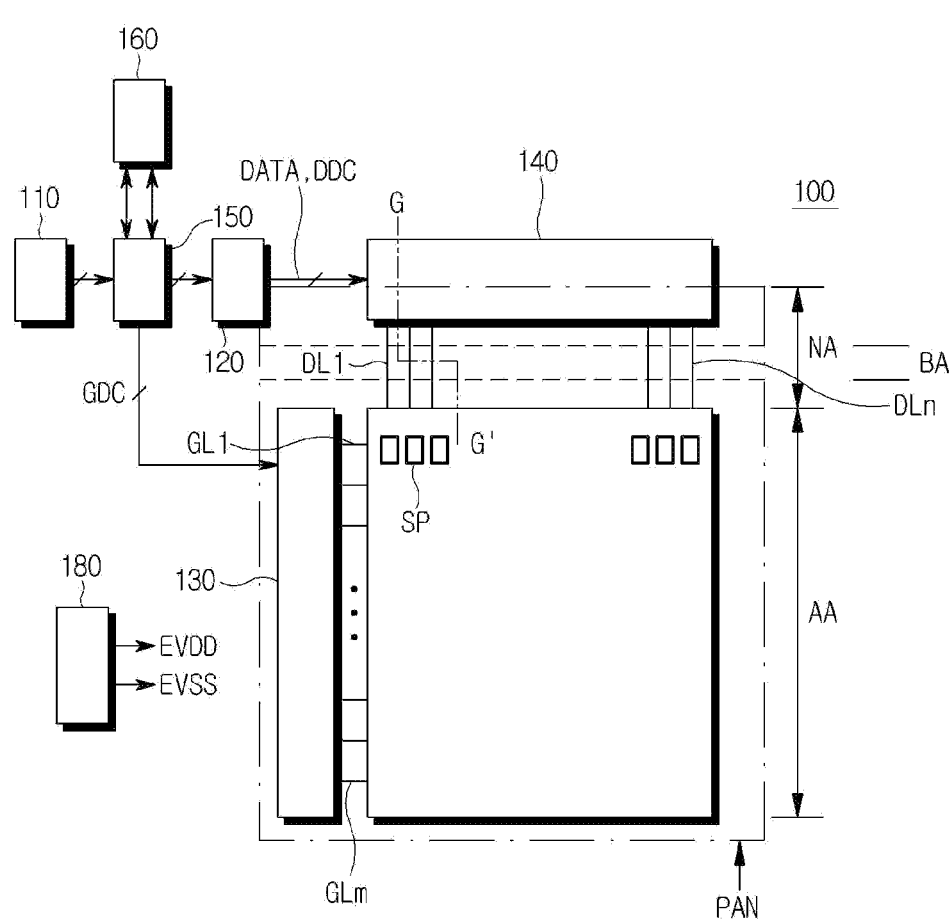
FIG. 1 is a schematic block diagram of an organic light emitting display device according to an embodiment of the present disclosure.

Advantages and features of the present disclosure, and a method of achieving them will become apparent with reference to the embodiments described below in detail in conjunction with the accompanying drawings. However, the present disclosure is not limited to the embodiment to be disclosed below and is implemented in different and various forms. The embodiments bring about the complete disclosure of the present disclosure and are only provided to make those skilled in the art understand the scope of the present disclosure.

The shapes, sizes, ratios, angles, numbers, and the like illustrated in the accompanying drawings for describing various embodiments of the present disclosure are merely examples, and the present disclosure is not limited thereto. Like reference numerals refer to like elements throughout. Further, in the following description of the present disclosure, a detailed description of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Elements are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

In describing temporal relationship, terms such as "after," "subsequent to," "next to," "before," and the like may include cases where any two events are not consecutive, unless the term "immediately" or "directly" is explicitly used.

In describing elements, terms such as "first" and "second" are used, but the elements are not limited by these terms. The terms are used only for distinguishing between one component and other components. Accordingly, as used herein, a first element may be a second element within the technical idea of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, an organic light emitting display device according to an embodiment of the present disclosure will be described with reference to the accompanying drawings.

FIG. 1 is a schematic block diagram of an organic light emitting display device according to the present disclosure.

Figure 2:
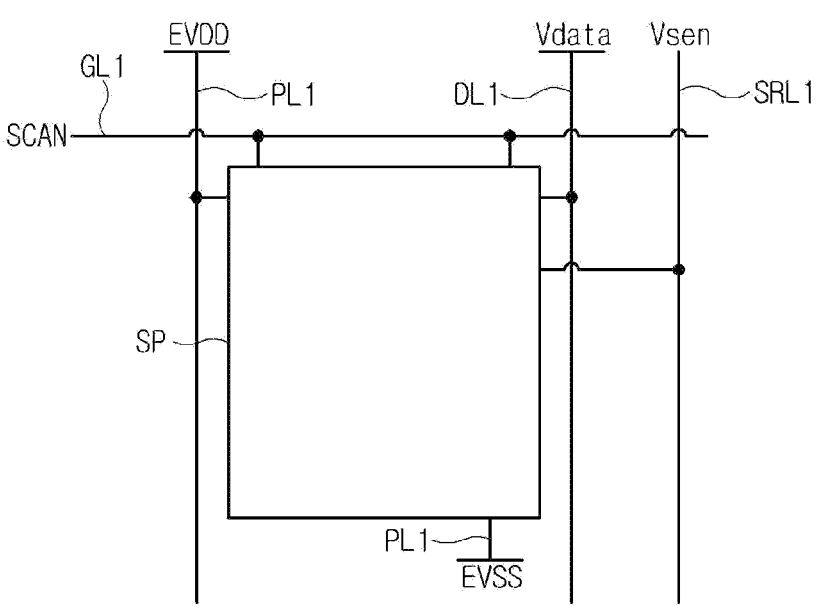
FIG. 2 is a schematic block diagram of a sub-pixel of the organic light emitting display device shown in FIG. 1 according to an embodiment of the present disclosure.

FIG. 2 is a schematic block diagram of a sub-pixel of the organic light emitting display device shown in FIG. 1.

Referring to FIG. 1, an organic light emitting display device 100 may include an image processing unit 110, a degradation compensation unit 150, a memory 160, a timing controller 120, a data driver 140, and a power supply 180 and a gate driver 130. A plurality of sub-pixels SP are arranged on a display panel PAN, and in some cases, the gate driver 130 may be formed in an in-panel manner.

The display panel PAN may include a display area AA, a non-display area NA, and a bending area BA. The display area AA is an area where the sub-pixels SP are disposed and an image is displayed. The non-display area NA is an area where no sub-pixel SP is disposed and an image is not displayed. The bending area BA is an area where the display panel PAN is bent when being folded in the rear surface thereof.

The image processing unit 110 may output image data supplied from the outside and driving signals for driving components. For example, the driving signal output from the image processing unit 110 may include a data enable signal, a vertical synchronization signal, a horizontal synchronization signal, a clock signal, or the like.

The deterioration compensation unit 150 may calculate a gain value for compensating for the deterioration of the sub-pixel SP based on a sensing voltage Vsne supplied from the data driver 140, and calculate a weight value based on the calculated gain value. After the calculation, the deterioration compensation unit 150 may modulate image data input to each sub-pixel SP of the current frame and supply the modulated image data to the timing controller 120.

The timing controller 120 may receive image data modulated by the degradation compensation unit 150 and various driving signals. The timing controller 120 may generate and output a gate timing control signal GDC for controlling the operation timing of the gate driver 130 and a data timing control signal DDC for controlling the operation timing of the data driver 140 based on the driving signal input from the image processing unit 110. In addition, the timing controller 120 may control the operation timing of the gate driver 130 and the data driver 140 and obtain a sensing voltage Vsen from the sub-pixels SP and supply the sensing voltage Vsen to the degradation compensation unit 150.

The gate driver 130 may output a scan signal to the display panel PAL in response to the gate timing control signal GDC supplied from the timing controller 120. The gate driver 130 may output scan signals through a plurality of gate lines GL1 to GLm. In this case, the gate driver 130 may be formed in an IC type, or may be formed inside the display panel PAN in an in-panel manner. The gate driver 130 may include a plurality of circuits such as shift registers and level shifters.

The data driver 140 may output a data voltage to the sub-pixel SP in response to the data timing control signal DDC input from the timing controller 120. The data driver 140 may sample and latch a digital data signal supplied from the timing controller 120 to convert the digital data signal into an analog data voltage based on the gamma voltage. The data driver 140 may output a data voltage through a plurality of data lines DL1 to DLn.

The power supply 180 may output a high potential driving voltage EVDD and a low potential driving voltage EVSS and supply them to the sub-pixel SP. The high potential driving voltage EVDD and the low potential driving voltage EVSS may be supplied through a power line. In this case, the voltage output from the power supply 180 may be output to the data driver 140 or the gate driver 130 and used to drive the data driver 140 or the gate driver 130.

The display area AA of the display panel PAN is comprised of a plurality of sub-pixels SP to display an actual image. The sub-pixels SP may include a red sub-pixel, a green sub-pixel and a blue sub-pixel, or include a white (W) sub-pixel, a red (R) sub-pixel, a green (G) sub-pixel and a blue (B) sub-pixel. In this case, the W, R, G, and B sub-pixels SP may all be formed to have the same area, but may be formed to have different areas.

The memory 160 may store not only a look-up table for deterioration compensation gains, but also deterioration compensation timings for an organic light emitting element of a sub-pixel SP. In this case, the deterioration compensation timings of the organic light emitting element may be the number of times of driving or driving time of an organic light emitting display panel.

As shown in FIG. 2, one sub-pixel SP may be connected to a gate line GL1, a data line DL1, a sensing voltage read-out line SRL1, and a power line PL1. The number of transistors and capacitors of the sub-pixel SP may be determined according to a circuit configuration, and a driving method may be determined.

Figure 3:
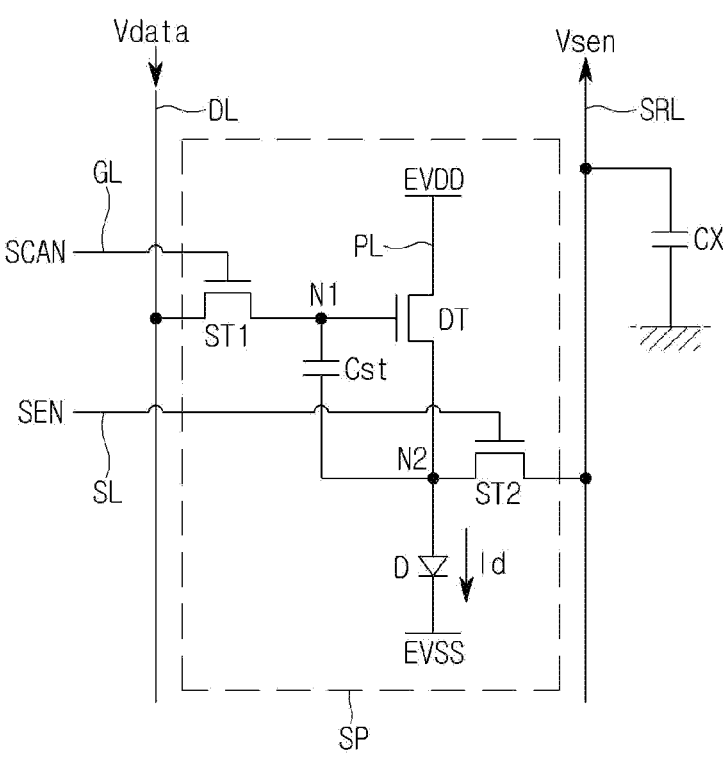
FIG. 3 is a circuit diagram showing a sub-pixel of an organic light emitting display device according to an embodiment of the present disclosure.

FIG. 3 is a circuit diagram showing a sub-pixel of an organic light emitting display device according to an embodiment of the present disclosure.

Referring to FIG. 3, an organic light emitting display device 100 according to an embodiment of the present disclosure may include gate lines GL and data lines DL which cross each other to define sub-pixels. In addition, the sub-pixel SP may include a power line PL and a sensing line SL. In addition, the sub-pixel SP may include a driving thin film transistor (TFT) DT, an organic light emitting element D, a storage capacitor Cst, a first switching TFT ST1, and a second switching TFT ST2.

The organic light emitting element D may include an anode electrode connected to a second node N2, a cathode electrode connected to an input terminal of a low potential driving voltage EVSS, and an organic light emitting layer positioned between the anode electrode and the cathode electrode.

The driving thin film transistor DT may control a current Id flowing through the organic light emitting element D according to a gate-source voltage Vgs. The driving thin film transistor DT may include a gate electrode connected to a first node N1, a drain electrode connected to the power line PL to receive a high potential driving voltage EVDD, and a source connected to the second node N2.

The storage capacitor Cst is connected between the first node N1 and the second node N2.

The first switching thin film transistor ST1 may apply a data voltage Vdata charged in the data line DL to the first node N1 in response to a gate signal SCAN to turn on the driving thin film transistor DT when the display panel PAN is driven. In this case, the first switching thin film transistor ST1 may include a gate electrode connected to the gate line GL to receive a scan signal SCAN, a drain electrode connected to the data line DL to receive a data voltage Vdata, and a source electrode connected to the first node N1.

The second switching thin film transistor ST2 may store a source voltage of the second node N2 in the sensing capacitor Cx of the sensing voltage read-out line SRL by switching a current between the second node N2 and the sensing voltage read-out line SRL in response to the sensing signal SEN. The second switching thin film transistor ST2 may reset the source voltage of driving thin film transistor DT to an initialization voltage by switching a current between the second node N2 and the sensing voltage read-out line SRL in response to the sensing signal SEN when the display panel PAN is driven. In this case, the gate electrode of the second switching thin film transistor ST2 may be connected to a sensing line SL, the drain electrode may be connected to the second node N2, and the source electrode may be connected to the sensing voltage read-out line SRL.

Prior to describing embodiments according to the present disclosure with reference to FIGS. 4 to 16, descriptions common throughout FIGS. 4 to 16 will be first given.

Although an organic light emitting display device having a 3T1C structure including three thin film transistors and one storage capacitor has been described as an example in the description with reference to FIG. 3, the organic light emitting display device of the present disclosure is not limited to the structure. For example, the organic light emitting display device of the present disclosure may be applied to various structures such as 4T1C, 5T1C, 6T1C, 7T1C, and 8T1C.

In describing embodiments below, a switching transistor ST may represent the first switching thin film transistor ST1 and the second switching thin film transistor ST2 described with reference to FIG. 3. That is, a sub-pixel may be applied to various structures such as 4T1C, 4T1C, 6T1C, 7T1, 8T1C or the like, in addition to the 2T1C described with reference to FIG. 3. The switching transistor ST may be a transistor other than the driving transistor DT in the sub-pixel SP. Therefore, according to the present disclosure, transistors, except for the driving transistor DT in the sub-pixel SP may have the same structure. As will be described later, configuring the driving transistor DT as an oxide semiconductor and the switching transistor ST as an oxide semiconductor may refer to configuring all transistors in the sub-pixel SP as an oxide semiconductor, that is, forming a so-called all-oxide sub-pixel. It should be noted that the all-oxide sub-pixel is different from a so-called hybrid sub-pixel in which some transistors are configured as an oxide semiconductor and some transistors are configured as a polycrystalline semiconductor.

A substrate 610 may be configured as multiple layers in which organic layers and inorganic layers are alternately stacked. For example, the substrate 610 may be formed by alternately stacking organic layers such as polyimide and inorganic layers such as silicon oxide (SiO2).

A buffer layer 620 may be formed on the substrate 610. The buffer layer 620 is to prevent or at least reduce moisture from permeating from the outside, and may be formed by stacking an inorganic film such as silicon oxide (SiO2) in a single layer or in multiple layers.

A first interlayer insulating layer 630 may be formed on the buffer layer 620. The first interlayer insulating layer 630 may be made of silicon nitride (SiNX) containing hydrogen particles. Alternatively, the first interlayer insulating layer 630 may be made of silicon oxide (SiOX). Alternatively, the first interlayer insulating layer 630 may have a multilayer structure in which silicon oxide and silicon nitride are alternately stacked.

A gate insulating layer 640 may be formed on the first interlayer insulating layer 630. The gate insulating layer 640 may insulate semiconductor patterns 220 and 320. The gate insulating layer 640 may be made of silicon oxide. Alternatively, the gate insulating layer 640 may be made of silicon nitride. Contact holes for connecting the semiconductor patterns 220 and 330 to source electrodes 230S and 330S and drain electrodes 230D and 330D may be formed in the gate insulating layer 640.

A second interlayer insulating layer 650 may be formed on the gate insulating layer 640. The second interlayer insulating layer 650 may be made of silicon nitride containing hydrogen particles or silicon oxide. Alternatively, the second interlayer insulating layer 650 may have a multilayer structure in which silicon oxide and silicon nitride are alternately stacked. Contact holes for connecting the semiconductor patterns 220 and 330 to source electrodes 230S and 330S and drain electrodes 230D and 330D may be formed in the second interlayer insulating layer 650.

A third interlayer insulating layer 660 may be formed on the second interlayer insulating layer 650. The third interlayer insulating layer 660 may be made of silicon nitride containing hydrogen particles or silicon oxide. Alternatively, the second interlayer insulating layer 650 may have a multilayer structure in which silicon oxide and silicon nitride are alternately stacked. A contact hole for connecting an anode electrode 510 to the drain electrode 330D may be formed in the third interlayer insulating layer 660.

A planarization layer 670 may be formed on the third interlayer insulating layer 660. The planarization layer 670 may be made of an organic material such as photoacrylic. Alternatively, the planarization layer 670 may be comprised of a plurality of layers including an inorganic layer and an organic layer. A contact hole for connecting the anode electrode 510 to the drain electrode 330D may be formed in the planarization layer 670.

The anode electrode 510 may be formed on the planarization layer 670. The anode electrode 510 may be comprised of a single layer or a plurality of layers made of metals such as Ca, Ba, Mg, Al, or Ag or an alloy thereof. The anode electrode 510 may be connected to the drain electrode 230D of the driving thin film transistor DT, and therefore, an image signal may be applied to the anode electrode 510 from the outside.

A bank layer 680 may be formed on the planarization layer 670 and the anode electrode 510. The bank layer 680 is a kind of partition wall, and may separate sub-pixels from one another to prevent or at least reduce light emitted from adjacent sub-pixels SP from being mixed with each other.

The organic light emitting layer 520 may be formed on the anode electrode 510 and an inclined surface of the bank layer 680. The organic light emitting layer 620 may be formed in each sub-pixel and may include an "R" organic light emitting layer emitting red light, a "G" organic light emitting layer emitting green light, and a "B" organic light emitting layer emitting blue light. In addition, the organic light emitting layer 520 may include a "W" organic light emitting layer emitting white light.

A cathode electrode 530 may be formed on the organic light emitting layer 520. The cathode electrode 530 may be made of a transparent conductive material such as indium tin oxide (ITO) or indium zinc oxide (IZO), and may be formed to have a thin thickness so as to transmit light therethrough.

An encapsulation layer 690 may be formed on the cathode electrode 530. The encapsulation layer 690 may be configured as a single layer made of an inorganic layer or may be configured as multiple layers including an inorganic layer and an organic layer.

Figure 4:
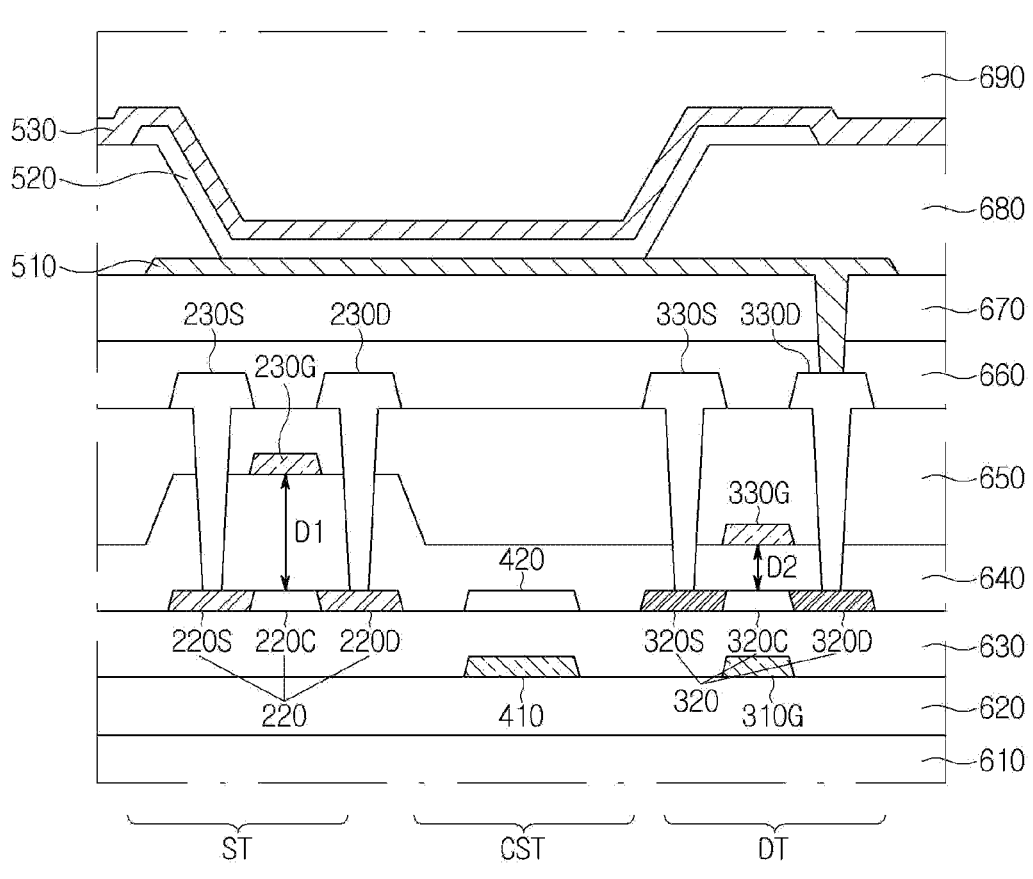
FIG. 4 is a cross-sectional view of a sub-pixel according to an embodiment of the present disclosure.

FIG. 4 is a cross-sectional view of a sub-pixel according to an embodiment of the present disclosure.

Referring to FIG. 4, a sub-pixel may include a switching transistor ST, a storage capacitor Cst, and a driving transistor DT.

The switching transistor ST may include a first semiconductor pattern 220, a first source electrode 230S, a first gate electrode 230G, and a first drain electrode 230D.

The first semiconductor pattern 220 may be formed on the first interlayer insulating layer 630. The first semiconductor pattern 220 may include a first source region 220S, a first channel region 220C, and a first drain region 220D. The first source region 220S is a region that contacts the first source electrode 230S. The first drain region 220D is a region that contacts the first drain electrode 230D. The first channel region 220C is a region between the first source region 220S and the first drain region 220D. As will be described later with reference to FIG. 5, the first gate electrode 230G may be disposed over the first semiconductor pattern 220 made of oxide, and thereafter, an ion implantation process may be performed. Since the first gate electrode 230G serves as a kind of mask, the center portion of the first semiconductor pattern 220 has no conductivity, but the left portion and the right portion of the first semiconductor pattern 220 have conductivity, thereby forming the first source region 220S and the first drain region 220D.

In the present embodiment, the first semiconductor pattern 220 may be an oxide semiconductor made of oxide. That is, the switching transistor ST may be an oxide semiconductor.

The first source electrode 230S may be formed on the second interlayer insulating layer 650. The first source electrode 230S may be electrically connected to the first source region 220S through a contact hole passing through the second interlayer insulating layer 650 and the gate insulating layer 640.

The first drain electrode 230D may be formed on the second interlayer insulating layer 650. The first drain electrode 230D may be electrically connected to the first drain region 220D through a contact hole passing through the second interlayer insulating layer 650 and the gate insulating layer 640.

The first gate electrode 230G may be formed on the gate insulating layer 640. When a signal is applied to the first gate electrode 230G, the first semiconductor pattern 220 is activated by the gate electrode 230G, and the signal applied to the first source electrode 230S may be transferred to the first drain electrode 230D by passing through the first semiconductor pattern 220. Since the first gate electrode 230G is positioned above the first semiconductor pattern 220, the above-described structure may be referred to as a top gate method. However, the first gate electrode 230G may be positioned under the first semiconductor pattern 220. For example, the first gate electrode 230G may be formed on the buffer layer 620. In this case, since the first gate electrode 230G is positioned under the first semiconductor pattern 220, the above-described structure may be referred to as a bottom gate method.

The first source electrode 230S, the first drain electrode 230D, and the first gate electrode 230G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the first source electrode 230S, the first drain electrode 230D, and the first gate electrode 230G may be formed as a single layer or multiple layers.

The storage capacitor CST may include a first electrode 410 and a second electrode 420. The first electrode 410 may be disposed on the buffer layer 620, and the second electrode 420 may be disposed on the first interlayer insulating layer 630. The second electrode 420 may be made of the same material as the semiconductor pattern 220 of the switching transistor ST in the same process. The first electrode 410 may be made of the same material as an auxiliary gate electrode 310G of the driving transistor DT in the same process. The first electrode 410 and the second electrode 420 may be spaced apart from each other.

The driving transistor DT may include a second semiconductor pattern 320, a second source electrode 330S, a second gate electrode 330G, and a second drain electrode 330D.

The second semiconductor pattern 320 may be disposed on the first interlayer insulating layer 630. The second semiconductor pattern 320 may include a second source region 320S, a second channel region 320C, and a second drain region 320D. The second source region 320S is a region that contacts the second source electrode 330S. The second drain region 320D is a region that contacts the second drain electrode 330D. The second channel region 320C is a region disposed between the second source region 320S and the second drain region 320D. As described below with reference to FIG. 5, the second gate electrode 330G may be disposed over the second semiconductor pattern 320 made of oxide, and thereafter, an ion implantation process may be performed. Since the second gate electrode 330G serves as a kind of mask, the center portion of the second semiconductor pattern 320 has no conductivity, but the left portion and the right portion of the second 320S and the second drain region 320D. The second semiconductor pattern 320 may be made of the same material as the first semiconductor pattern 220 in the same process.

In the present embodiment, the second semiconductor pattern 320 may be an oxide semiconductor made of oxide. That is, the driving transistor DT may be an oxide semiconductor.

The second source electrode 330S may be formed on the second interlayer insulating layer 650. The second source electrode 330S may be electrically connected to the second source region 320S through a contact hole passing through the second interlayer insulating layer 650 and the gate insulating layer 640.

The second drain electrode 330D may be formed on the second interlayer insulating layer 650. The second drain electrode 330D may be electrically connected to the second drain region 320D through a contact hole passing through the second interlayer insulating layer 650 and the gate insulating layer 640.

The second source electrode 330S and the second drain electrode 330D may be made of the same material as the first source electrode 230S and the first drain electrode 230D in the same process.

The second gate electrode 330G may be formed on the gate insulating layer 640. When a signal is applied to the second gate electrode 330G, the second semiconductor pattern 320 may be activated by the gate electrode 330G, and the signal applied to the second source electrode 330S may be transferred to the second drain electrode 330D by passing through the second semiconductor pattern 320. Since the second gate electrode 330G is positioned above the second semiconductor pattern 320, the above-described structure may be referred to as a top gate method. It is noted that the second gate electrode 330G may be positioned under the second semiconductor pattern 320. For example, the second gate electrode 330G may be formed on the buffer layer 620. In this case, since the second gate electrode 330G is positioned under the second semiconductor pattern 320, the above-described structure may be referred to as a bottom gate method.

The second source electrode 330S, the second drain electrode 330D, and the second gate electrode 330G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the second source electrode 330S, the second drain electrode 330D, and the second gate electrode 330G may be formed as a single layer or multiple layers.

Additionally, the driving transistor DT may further include an auxiliary gate electrode 310G. The auxiliary gate electrode 310G may be formed on the buffer layer 620. When the driving transistor DT includes both the second gate electrode 320G and the auxiliary gate electrode 310G, the driving transistor DT may be driven in a so-called double gate method including two gate electrodes.

According to the present embodiment, the dose of the first semiconductor pattern 220 may be different from the dose of the second semiconductor pattern 320. The dose may refer to the amount of dopant implanted into the surface of the semiconductor pattern for one second per one square centimeter in an ion implantation process. Specifically, the dose of the second semiconductor pattern 320 may be larger than the dose of the first semiconductor pattern 220. For example, when the dose of the first semiconductor pattern 220 is referred to as a first dose and the dose of the second semiconductor pattern 320 is referred to as a second dose, the second dose may be larger than the first dose.

According to the present embodiment, a distance D1 between the gate electrode 230G and semiconductor pattern 220 of the switching transistor ST may be larger than a distance D2 between the gate electrode 330G and the semiconductor pattern 320 of the driving transistor DT. In other words, the distance D1 between the first gate electrode 230G and the first semiconductor pattern 220 may be larger than the distance D2 between the second gate electrode 330G and the second semiconductor pattern 320. In other words, the distance D1 between the first gate electrode 230G and the first channel region 220C may be larger than the distance D2 between the second gate electrode 330G and the second channel region 320C.

According to the present embodiment, a difference between the dose of the first semiconductor pattern 220 and the dose of the second semiconductor pattern 320 may imply the following technical meaning. A driving transistor DT and a switching transistor ST are disposed in a sub-pixel. Both the driving transistor DT and the switching transistor ST include an oxide semiconductor. Since the transistors in the sub-pixel include semiconductors of the same type (oxide), the transistors may be produced in the same process, thus improving productivity and reducing manufacturing costs. However, since the driving transistor DT and the switching transistor ST have different functions, required device performances are also different. For example, the driving transistor DT and the switching transistor ST are different in device performances such as threshold voltage, on-current, off-current, charge mobility or the like. However, when the transistors are fabricated as the same type in the same process, the driving transistor DT and the switching transistor ST may have the same device performance. According to the present disclosure, the driving transistor DT and the switching transistor ST are fabricated as the same type in the same process, but the first semiconductor pattern 220 and the second semiconductor pattern 320 are different in dose. Therefore, the driving transistor DT and the switching transistor ST may have different device performance.

A method of producing the sub-pixel described in FIG. 4 will be described with reference to FIG. 5.

Figure 5:
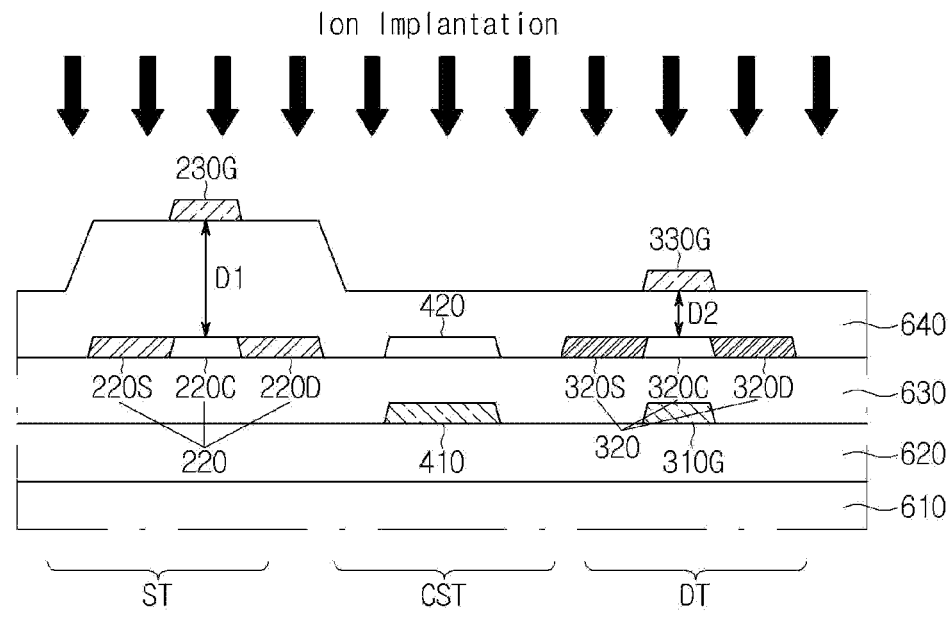
FIG. 5 is a diagram for describing a method of producing the sub-pixel of FIG. 4 according to an embodiment of the present disclosure.

FIG. 5 is a diagram for describing a method of producing the sub-pixel of FIG. 4.

Referring to FIG. 5, a substrate 610 is provided, and a buffer layer 620 is formed on the substrate 610. A first electrode 410 and an auxiliary gate electrode 310G may be formed on the buffer layer 620. The auxiliary gate electrode 310G may not be selectively formed. The first electrode 410 and the auxiliary gate electrode 310G may be formed of the same material in the same process. A first interlayer insulating layer 630 may be formed on the first electrode 410 and the auxiliary gate electrode 310G. A first semiconductor pattern 220, a second electrode 420, and a second semiconductor pattern 320 may be formed on the first interlayer insulating layer 630. The first semiconductor pattern 220, the second electrode 420, and the second semiconductor pattern 320 may be made of the same material in the same process.

A gate insulating layer 640 may be formed on the first semiconductor pattern 220, the second electrode 420 and the second semiconductor pattern 320. The gate insulating layer 640 may be formed to have different heights at the first semiconductor pattern 220 and the second semiconductor pattern 320. Specifically, the gate insulating layer 640 may be formed to have a first distance D1 from the first semiconductor pattern 220 and a second distance D2 from the second semiconductor pattern 320. The first distance D1 may be larger than the second distance D2.

The first gate electrode 230G and the second gate electrode 330G may be formed on the gate insulating layer 640. The first gate electrode 230G and the second gate electrode 330G may be formed of the same material in the same process.

Thereafter, an ion implantation process may be performed. The ion implantation process is a process of physically implanting ions formed using a source gas into a semiconductor pattern. When an electric field is applied to charged ion particles to accelerate the ion particles toward the semiconductor pattern, dopant collides with the semiconductor pattern and the ions are implanted into the semiconductor pattern. The depth at which the dopant is implanted may be controlled by adjusting acceleration energy, and the amount of dopant may be controlled by measuring an ion current.

Since the first gate electrode 230G is disposed over the first semiconductor pattern 220, dopant is not implanted into a portion overlapping the first gate electrode 230G and thus, the first channel region 220C is formed. Dopant is implanted into one side portion that does not overlap the first gate electrode 230G and thus, the first source region 220S is formed. Dopant is implanted into the other side portion that does not overlap the first gate electrode 230G and thus, the first drain region 220D is formed.

Since the second gate electrode 330G is disposed over the second semiconductor pattern 320, dopant is not implanted into a portion overlapping the second gate electrode 330G, and thus, the second channel region 320C is formed. Dopant is implanted into one side portion that does not overlap the second gate electrode 330G and thus, the second source region 320S is formed. Dopant is implanted into the other side portion that does not overlap the second gate electrode 330G and thus, the second drain region 320D is formed.

According to the present embodiment, the distance D1 between the first gate electrode 230G and the first semiconductor pattern 220 may be different from the distance D2 between the second gate electrode 330G and the second semiconductor pattern 320. The distance D1 may be larger than distance D2. Accordingly, the dose implanted into the first semiconductor pattern 220 of the switching transistor ST may be smaller than the dose implanted into the second semiconductor pattern 320 of the driving transistor DT. Conversely, the dose implanted into the second semiconductor pattern 320 of the driving transistor DT may be larger than the dose implanted into the first semiconductor pattern 220 of the switching transistor ST.

Figure 6:
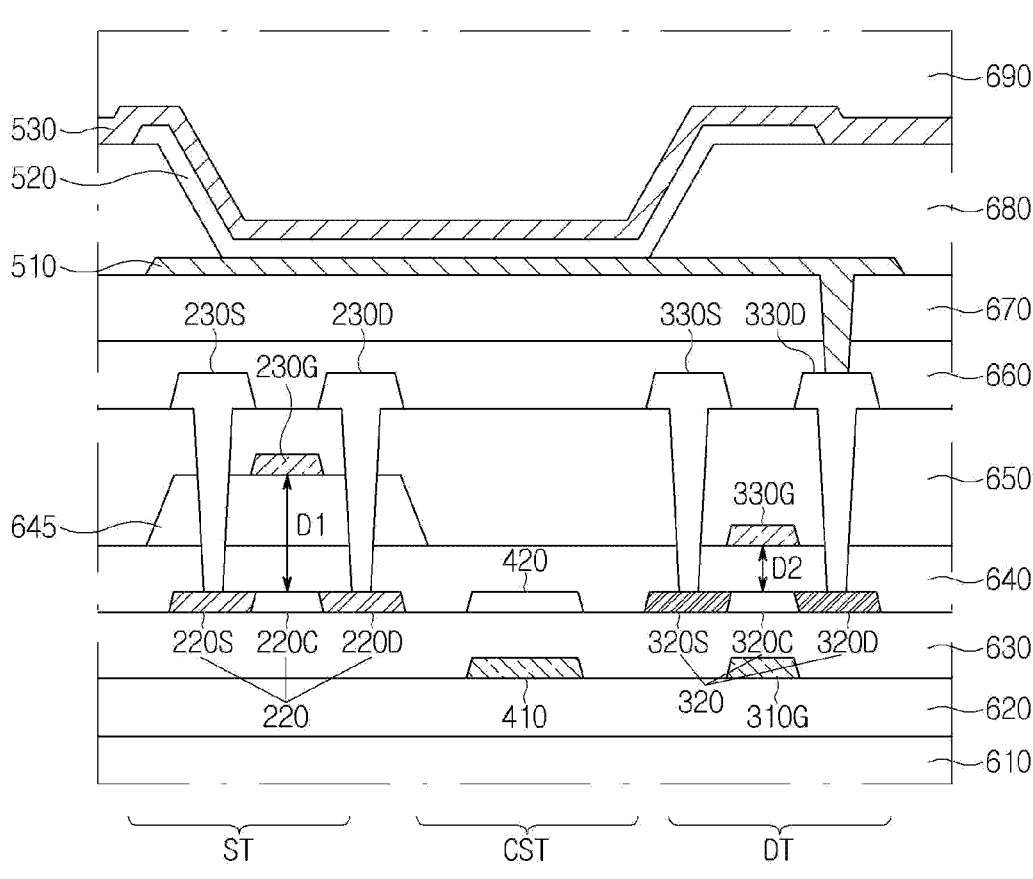
FIG. 6 is a cross-sectional view of a sub-pixel according to another embodiment of the present disclosure.

FIG. 6 is a cross-sectional view of a sub-pixel according to another embodiment of the present disclosure.

Referring to FIG. 6, a sub-pixel may include a switching transistor ST, a storage capacitor Cst, and a driving transistor DT.

The switching transistor ST may include a first semiconductor pattern 220, a first source electrode 230S, a first gate electrode 230G, and a first drain electrode 230D.

The first semiconductor pattern 220 may be formed on the first interlayer insulating layer 630. The first semiconductor pattern 220 may include a first source region 220S, a first channel region 220C, and a first drain region 220D. The first source region 220S is a region in contact with the first source electrode 230S. The first drain region 220D is a region that contacts the first drain electrode 230D. The first channel region 220C is a region between the first source region 220S and the first drain region 220D. As will be described later with reference to FIG. 7, the first gate electrode 230G may be disposed over the first semiconductor pattern 220 made of oxide, and thereafter, an ion implantation process may be performed. Since the first gate electrode 230G serves as a kind of mask, the center portion of the first semiconductor pattern 220 has no conductivity, but the left portion and the right portion of the first semiconductor pattern 220 have conductivity, thereby forming the first source region 220S and the first drain region 220D.

In the present embodiment, the first semiconductor pattern 220 may be an oxide semiconductor made of oxide. That is, the switching transistor ST may be an oxide semiconductor.

The first source electrode 230S may be formed on the second interlayer insulating layer 650. The first source electrode 230S may be electrically connected to the first source region 220S through a contact hole passing through the second interlayer insulating layer 650, an auxiliary interlayer insulating layer 645 and the gate insulating layer 640.

The first drain electrode 230D may be formed on the second interlayer insulating layer 650. The first drain electrode 230D may be electrically connected to the first drain region 220D through a contact hole passing through the second interlayer insulating layer 650, the auxiliary interlayer insulating layer 645, and the gate insulating layer 640.

The first gate electrode 230G may be formed on the auxiliary interlayer insulating layer 645. The auxiliary interlayer insulating layer 645 may be formed on the gate insulating layer 640. The auxiliary interlayer insulating layer 645 is a layer for securing a distance D1 between the first gate electrode 230G and the first semiconductor pattern 220. When a signal is applied to the first gate electrode 230G, the first semiconductor pattern 220 is activated by the gate electrode 230G, and the signal applied to the first source electrode 230S may be transferred to the first drain electrode 230D by passing through the first semiconductor pattern 220. Since the first gate electrode 230G is positioned above the first semiconductor pattern 220, the above-described structure may be referred to as a top gate method. However, the first gate electrode 230G may be positioned under the first semiconductor pattern 220. For example, the first gate electrode 230G may be formed on the buffer layer 620. In this case, since the first gate electrode 230G is positioned under the first semiconductor pattern 220, the above-described structure may be referred to as a bottom gate method.

The first source electrode 230S, the first drain electrode 230D, and the first gate electrode 230G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the first source electrode 230S, the first drain electrode 230D, and the first gate electrode 230G may be formed as a single layer or multiple layers.

The storage capacitor CST may include a first electrode 410 and a second electrode 420. The first electrode 410 may be disposed on the buffer layer 620, and the second electrode 420 may be disposed on the first interlayer insulating layer 630. The second electrode 420 may be made of the same material as the semiconductor pattern 220 of the switching transistor ST in the same process. The first electrode 410 may be made of the same material as an auxiliary gate electrode 310G of the driving transistor DT in the same process. The first electrode 410 and the second electrode 420 may be spaced apart from each other.

The driving transistor DT may include a second semiconductor pattern 320, a second source electrode 330S, a second gate electrode 330G, and a second drain electrode 330D.

The second semiconductor pattern 320 may be disposed on the first interlayer insulating layer 630. The second semiconductor pattern 320 may include a second source region 320S, a second channel region 320C, and a second drain region 320D. The second source region 320S is a region that contacts the second source electrode 330S. The second drain region 320D is a region that contacts the second drain electrode 330D. The second channel region 320C is a region disposed between the second source region 320S and the second drain region 320D. As described below with reference to FIG. 7, the second gate electrode 330G may be disposed over the second semiconductor pattern 320 made of oxide, and thereafter, an ion implantation process may be performed. Since the second gate electrode 330G serves as a kind of mask, the center portion of the second semiconductor pattern 320 has no conductivity, but the left portion and the right portion of the second 320S and the second drain region 320D. The second semiconductor pattern 320 may be made of the same material as the first semiconductor pattern 220 in the same process.

In the present embodiment, the second semiconductor pattern 320 may be an oxide semiconductor made of oxide. That is, the driving transistor DT may be an oxide semiconductor.

The second source electrode 330S may be formed on the second interlayer insulating layer 650. The second source electrode 330S may be electrically connected to the second source region 320S through a contact hole passing through the second interlayer insulating layer 650 and the gate insulating layer 640.

The second drain electrode 330D may be formed on the second interlayer insulating layer 650. The second drain electrode 330D may be electrically connected to the second drain region 320D through a contact hole passing through the second interlayer insulating layer 650 and the gate insulating layer 640.

The second source electrode 330S and the second drain electrode 330D may be made of the same material as the first source electrode 230S and the first drain electrode 230D in the same process.

The second gate electrode 330G may be formed on the gate insulating layer 640. When a signal is applied to the second gate electrode 330G, the second semiconductor pattern 320 may be activated by the gate electrode 330G, and the signal applied to the second source electrode 330S may be transferred to the second drain electrode 330D by passing through the second semiconductor pattern 320. Since the second gate electrode 330G is positioned above the second semiconductor pattern 320, the above-described structure may be referred to as a top gate method. It is noted that the second gate electrode 330G may be positioned under the second semiconductor pattern 320. For example, the second gate electrode 330G may be formed on the buffer layer 620. In this case, since the second gate electrode 330G is positioned under the second semiconductor pattern 320, the above-described structure may be referred to as a bottom gate method.

The second source electrode 330S, the second drain electrode 330D, and the second gate electrode 330G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the second source electrode 330S, the second drain electrode 330D, and the second gate electrode 330G may be formed as a single layer or multiple layers.

Additionally, the driving transistor DT may further include an auxiliary gate electrode 310G. The auxiliary gate electrode 310G may be formed on the buffer layer 620. When the driving transistor DT includes both the second gate electrode 320G and the auxiliary gate electrode 310G, the driving transistor DT may be driven in a so-called double gate method including two gate electrodes.

According to the present embodiment, the dose of the first semiconductor pattern 220 may be different from the dose of the second semiconductor pattern 320. The dose may refer to the amount of dopant implanted into the surface of the semiconductor pattern for one second per one square centimeter in an ion implantation process. Specifically, the dose of the second semiconductor pattern 320 may be larger than the dose of the first semiconductor pattern 220. For example, when the dose of the first semiconductor pattern 220 is referred to as a first dose and the dose of the second semiconductor pattern 320 is referred to as a second dose, the second dose may be larger than the first dose.

According to the present embodiment, a distance D1 between the gate electrode 230G and semiconductor pattern 220 of the switching transistor ST may be larger than a distance D2 between the gate electrode 330G and the semiconductor pattern 320 of the driving transistor DT. In other words, the distance D1 between the first gate electrode 230G and the first semiconductor pattern 220 may be larger than the distance D2 between the second gate electrode 330G and the second semiconductor pattern 320. In other words, the distance D1 between the first gate electrode 230G and the first channel region 220C may be larger than the distance D2 between the second gate electrode 330G and the second channel region 320C.

According to the present embodiment, a difference between the dose of the first semiconductor pattern 220 and the dose of the second semiconductor pattern 320 may imply the following technical meaning. A driving transistor DT and a switching transistor ST are disposed in a sub-pixel. Both the driving transistor DT and the switching transistor ST include an oxide semiconductor. Since the transistors in the sub-pixel include semiconductors of the same type (oxide), the transistors may be produced in the same process, thus improving productivity and reducing manufacturing costs. However, since the driving transistor DT and the switching transistor ST have different functions, required device performances are also different. For example, the driving transistor DT and the switching transistor ST are different in device performances such as threshold voltage, on-current, off-current, charge mobility or the like. However, when the transistors are fabricated as the same type in the same process, the driving transistor DT and the switching transistor ST may have the same device performance. According to the present disclosure, the driving transistor DT and the switching transistor ST are fabricated as the same type in the same process, but the first semiconductor pattern 220 and the second semiconductor pattern 320 are different in dose. Therefore, the driving transistor DT and the switching transistor ST may have different device performances.

A method of producing the sub-pixel described in FIG. 6 will be described with reference to FIG. 7.

Figure 7:
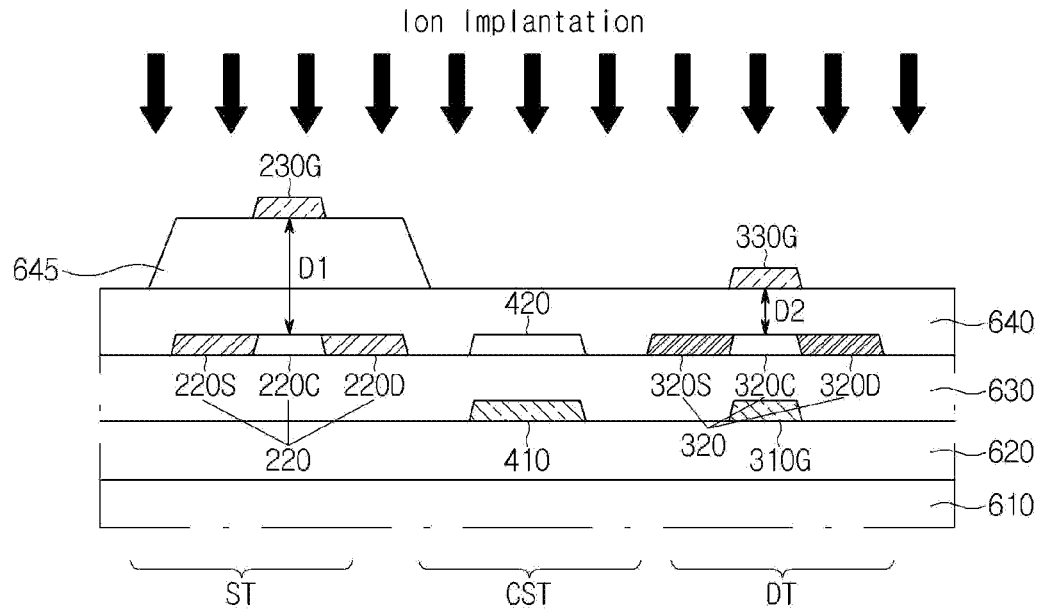
FIG. 7 is a diagram for describing a method of producing the sub-pixel of FIG. 6 according to an embodiment of the present disclosure.

FIG. 7 is a diagram for describing a method of producing the sub-pixel of FIG. 6.

Referring to FIG. 7, a substrate 610 is provided, and a buffer layer 620 is formed on the substrate 610. A first electrode 410 and an auxiliary gate electrode 310G may be formed on the buffer layer 620. The auxiliary gate electrode 310G may not be selectively formed. The first electrode 410 and the auxiliary gate electrode 310G may be formed of the same material in the same process. A first interlayer insulating layer 630 may be formed on the first electrode 410 and the auxiliary gate electrode 310G. A first semiconductor pattern 220, a second electrode 420, and a second semiconductor pattern 320 may be formed on the first interlayer insulating layer 630. The first semiconductor pattern 220, the second electrode 420, and the second semiconductor pattern 320 may be made of the same material in the same process.

A gate insulating layer 640 may be formed on the first semiconductor pattern 220, the second electrode 420 and the second semiconductor pattern 320. The auxiliary interlayer insulating layer 645 may be partially formed on the gate insulating layer 640. The auxiliary interlayer insulating layer 645 is a layer for securing a distance D1 between the first gate electrode 230G and the first semiconductor pattern 220. The auxiliary interlayer insulating layer 645 may be formed on the first semiconductor pattern 220. The auxiliary interlayer insulating layer 645 may not be formed on the second semiconductor pattern 320.

The first gate electrode 230G may be formed on the auxiliary interlayer insulating layer 645. The second gate electrode 330G may be formed on the gate insulating layer 640. The first gate electrode 230G and the second gate electrode 330G may be formed of the same material in the same process.

Thereafter, an ion implantation process may be performed. The ion implantation process is a process of physically implanting ions formed using a source gas into a semiconductor pattern. When an electric field is applied to charged ion particles to accelerate the ion particles toward the semiconductor pattern, dopant collides with the semiconductor pattern, and the ions are implanted into the semiconductor pattern. The depth at which the dopant is implanted may be controlled by adjusting acceleration energy, and the amount of dopant may be controlled by measuring an ion current.

Since the first gate electrode 230G is disposed over the first semiconductor pattern 220, dopant is not implanted into a portion overlapping the first gate electrode 230G, and thus the first channel region 220C is formed. Dopant is implanted into one side portion that does not overlap the first gate electrode 230G and thus, the first source region 220S is formed. Dopant is implanted into the other side portion that does not overlap the first gate electrode 230G, and thus, the first drain region 220D is formed.

Since the second gate electrode 330G is disposed over the second semiconductor pattern 320, dopant is not implanted into a portion overlapping the second gate electrode 330G, and thus, the second channel region 320C is formed. Dopant is implanted into one side portion that does not overlap the second gate electrode 330G, and thus, the second source region 320S is formed. Dopant is implanted into the other side portion that does not overlap the second gate electrode 330G, and thus, the second drain region 320D is formed.

According to the present embodiment, the distance D1 between the first gate electrode 230G and the first semiconductor pattern 220 may be different from the distance D2 between the second gate electrode 330G and the second semiconductor pattern 320. The distance D1 may be larger than distance D2. Accordingly, the dose implanted into the first semiconductor pattern 220 of the switching transistor ST is smaller than the dose implanted into the second semiconductor pattern 320 of the driving transistor DT. Conversely, the dose implanted into the second semiconductor pattern 320 of the driving transistor DT is larger than the dose implanted into the first semiconductor pattern 220 of the switching transistor ST.

Figure 8:
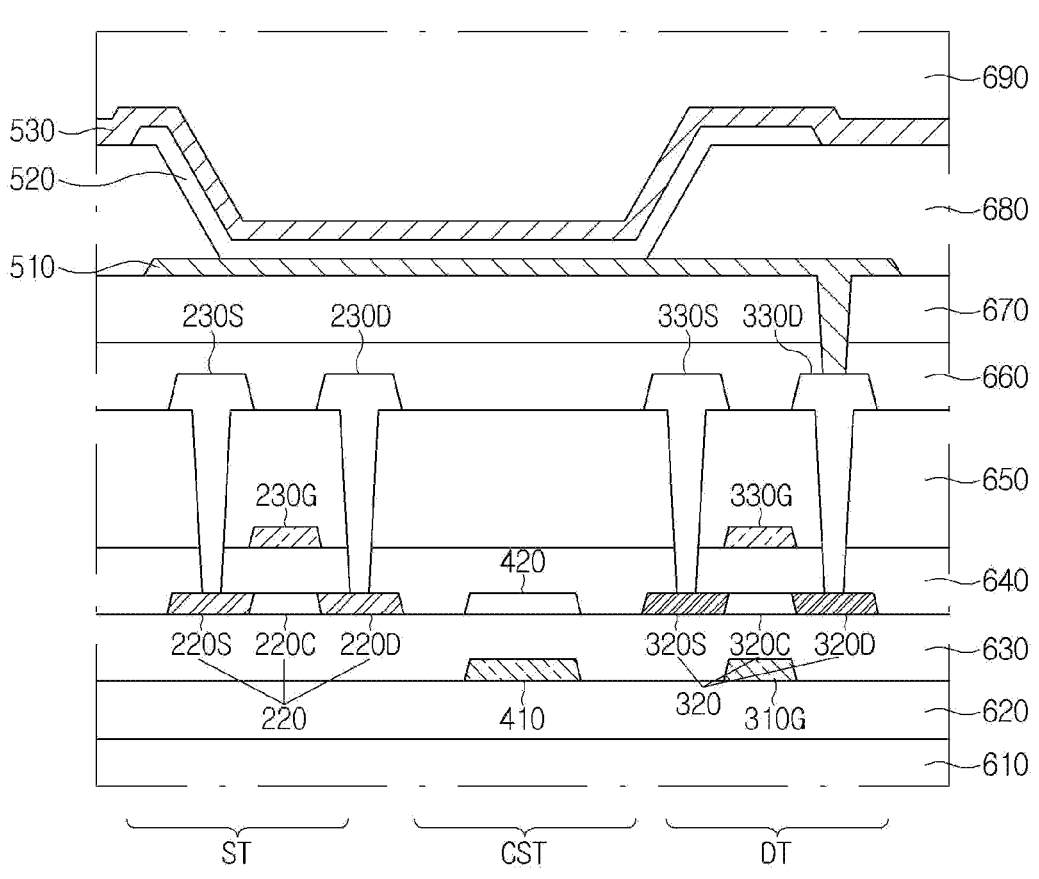
FIG. 8 is a cross-sectional view of a sub-pixel according to another embodiment of the present disclosure.

FIG. 8 is a cross-sectional view of a sub-pixel according to another embodiment of the present disclosure.

Unlike the embodiments described above with reference to FIGS. 4 and 6, in the present embodiment, a distance between the first gate electrode 230G and the first semiconductor pattern 220 is barely different from a distance between the second gate electrode 330G and the second semiconductor pattern 220.

Referring to FIG. 8, a sub-pixel may include a switching transistor ST, a storage capacitor Cst, and a driving transistor DT.

The switching transistor ST may include a first semiconductor pattern 220, a first source electrode 230S, a first gate electrode 230G, and a first drain electrode 230D.

The first semiconductor pattern 220 may be formed on the first interlayer insulating layer 630. The first semiconductor pattern 220 may include a first source region 220S, a first channel region 220C, and a first drain region 220D. The first source region 220S is a region in contact with the first source electrode 230S. The first drain region 220D is a region that contacts the first drain electrode 230D. The first channel region 220C is a region between the first source region 220S and the first drain region 220D. As will be described later with reference to FIGS. 9 to 10, the first gate electrode 230G may be disposed over the first semiconductor pattern 220 made of oxide, and thereafter, an ion implantation process may be performed. Since the first gate electrode 230G serves as a kind of mask, the center portion of the first semiconductor pattern 220 has no conductivity, but the left portion and the right portion of the first semiconductor pattern 220 have conductivity, thereby forming the first source region 220S and the first drain region 220D.

In the present embodiment, the first semiconductor pattern 220 may be an oxide semiconductor made of oxide. That is, the switching transistor ST may be an oxide semiconductor.

The first source electrode 230S may be formed on the second interlayer insulating layer 650. The first source electrode 230S may be electrically connected to the first source region 220S through a contact hole passing through the second interlayer insulating layer 650 and the gate insulating layer 640.

The first drain electrode 230D may be formed on the second interlayer insulating layer 650. The first drain electrode 230D may be electrically connected to the first drain region 220D through a contact hole passing through the second interlayer insulating layer 650 and the gate insulating layer 640.

The first gate electrode 230G may be formed on the gate insulating layer 640. When a signal is applied to the first gate electrode 230G, the first semiconductor pattern 220 is activated by the gate electrode 230G, and the signal applied to the first source electrode 230S may be transferred to the first drain electrode 230D by passing through the first semiconductor pattern 220. Since the first gate electrode 230G is positioned above the first semiconductor pattern 220, the above-described structure may be referred to as a top gate method. However, the first gate electrode 230G may be positioned under the first semiconductor pattern 220. For example, the first gate electrode 230G may be formed on the buffer layer 620. In this case, since the first gate electrode 230G is positioned under the first semiconductor pattern 220, the above-described structure may be referred to as a bottom gate method.

The first source electrode 230S, the first drain electrode 230D, and the first gate electrode 230G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the first source electrode 230S, the first drain electrode 230D, and the first gate electrode 230G may be formed as a single layer or multiple layers.

The storage capacitor CST may include a first electrode 410 and a second electrode 420. The first electrode 410 may be disposed on the buffer layer 620, and the second electrode 420 may be disposed on the first interlayer insulating layer 630. The second electrode 420 may be made of the same material as the semiconductor pattern 220 of the switching transistor ST in the same process. The first electrode 410 may be made of the same material as an auxiliary gate electrode 310G of the driving transistor DT in the same process. The first electrode 410 and the second electrode 420 may be spaced apart from each other.

The driving transistor DT may include a second semiconductor pattern 320, a second source electrode 330S, a second gate electrode 330G, and a second drain electrode 330D.

The second semiconductor pattern 320 may be disposed on the first interlayer insulating layer 630. The second semiconductor pattern 320 may include a second source region 320S, a second channel region 320C, and a second drain region 320D. The second source region 320S is a region that contacts the second source electrode 330S. The second drain region 320D is a region that contacts the second drain electrode 330D. The second channel region 320C is a region disposed between the second source region 320S and the second drain region 320D. As will be described later with reference to FIGS. 9 to 10, the second gate electrode 330G may be disposed over the second semiconductor pattern 320 made of oxide, and thereafter, an ion implantation process may be performed. Since the second gate electrode 330G serves as a kind of mask, the center portion of the second semiconductor pattern 320 has no conductivity, but the left portion and the right portion of the second semiconductor pattern 320 have conductivity, thereby forming the second source region 320S and the second drain region 320D. The second semiconductor pattern 320 may be made of the same material as the first semiconductor pattern 220 in the same process.

In the present embodiment, the second semiconductor pattern 320 may be an oxide semiconductor made of oxide. That is, the driving transistor DT may be an oxide semiconductor.

The second source electrode 330S may be formed on the second interlayer insulating layer 650. The second source electrode 330S may be electrically connected to the second source region 320S through a contact hole passing through the second interlayer insulating layer 650 and the gate insulating layer 640.

The second drain electrode 330D may be formed on the second interlayer insulating layer 650. The second drain electrode 330D may be electrically connected to the second drain region 320D through a contact hole passing through the second interlayer insulating layer 650 and the gate insulating layer 640.

The second source electrode 330S and the second drain electrode 330D may be made of the same material as the first source electrode 230S and the first drain electrode 230D in the same process.

The second gate electrode 330G may be formed on the gate insulating layer 640. When a signal is applied to the second gate electrode 330G, the second semiconductor pattern 320 may be activated by the gate electrode 330G, and the signal applied to the second source electrode 330S may be transferred to the second drain electrode 330D by passing through the second semiconductor pattern 320. Since the second gate electrode 330G is positioned above the second semiconductor pattern 320, the above-described structure may be referred to as a top gate method. It is noted that the second gate electrode 330G may be positioned under the second semiconductor pattern 320. For example, the second gate electrode 330G may be formed on the buffer layer 620. In this case, since the second gate electrode 330G is positioned under the second semiconductor pattern 320, the above-described structure may be referred to as a bottom gate method.

The second source electrode 330S, the second drain electrode 330D, and the second gate electrode 330G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the second source electrode 330S, the second drain electrode 330D, and the second gate electrode 330G may be formed as a single layer or multiple layers.

Additionally, the driving transistor DT may further include an auxiliary gate electrode 310G. The auxiliary gate electrode 310G may be formed on the buffer layer 620. When the driving transistor DT includes both the second gate electrode 320G and the auxiliary gate electrode 310G, the driving transistor DT may be driven in a so-called double gate method including two gate electrodes.

According to the present embodiment, the dose of the first semiconductor pattern 220 may be different from the dose of the second semiconductor pattern 320. The dose may refer to the amount of dopant implanted into the surface of the semiconductor pattern for one second per one square centimeter in an ion implantation process. Specifically, the dose of the second semiconductor pattern 320 may be larger than the dose of the first semiconductor pattern 220. For example, when the dose of the first semiconductor pattern 220 is referred to as a first dose and the dose of the second semiconductor pattern 320 is referred to as a second dose, the second dose may be larger than the first dose.

According to the present embodiment, a distance between the gate electrode 230G and semiconductor pattern 220 of the switching transistor ST may be equal to a distance between the gate electrode 330G and the semiconductor pattern 320 of the driving transistor DT.

According to the present embodiment, a difference between the dose of the first semiconductor pattern 220 and the dose of the second semiconductor pattern 320 may imply the following technical meaning. A driving transistor DT and a switching transistor ST are disposed in a sub-pixel. Both the driving transistor DT and the switching transistor ST include an oxide semiconductor. Since the transistors in the sub-pixel include semiconductors of the same type (oxide), the transistors may be produced in the same process, thus improving productivity and reducing manufacturing costs. However, since the driving transistor DT and the switching transistor ST have different functions, required device performances are also different. For example, the driving transistor DT and the switching transistor ST are different in device performances such as threshold voltage, on-current, off-current, charge mobility or the like. However, when the transistors are fabricated as the same type in the same process, the driving transistor DT and the switching transistor ST may have the same device performance. According to the present disclosure, the driving transistor DT and the switching transistor ST are fabricated as the same type in the same process, but the first semiconductor pattern 220 and the second semiconductor pattern 320 are different in dose. Therefore, the driving transistor DT and the switching transistor ST may have different device performance.

Figure 9:
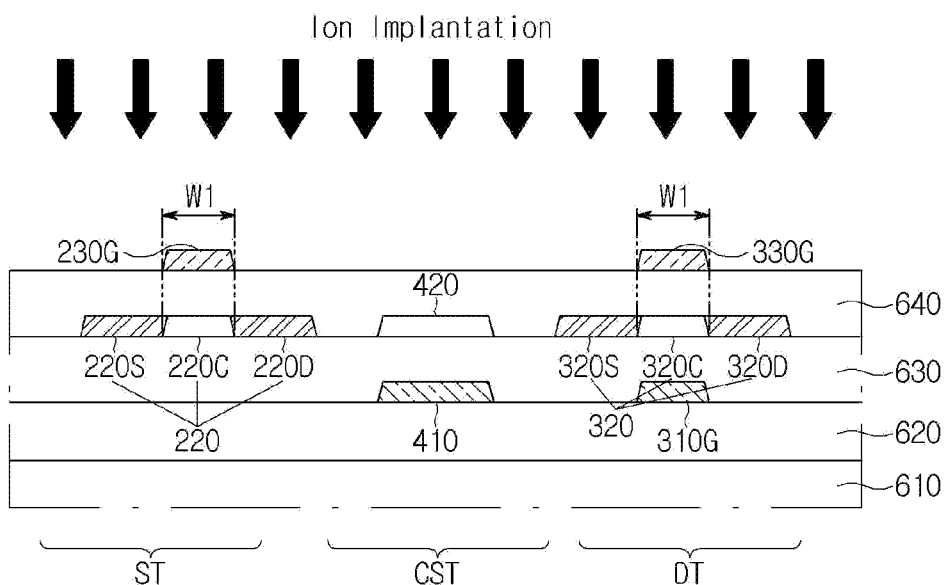
FIGS. 9 and 10 are diagrams for describing a method of producing the sub-pixel of FIG. 8 according to an embodiment of the present disclosure.
Figure 10:
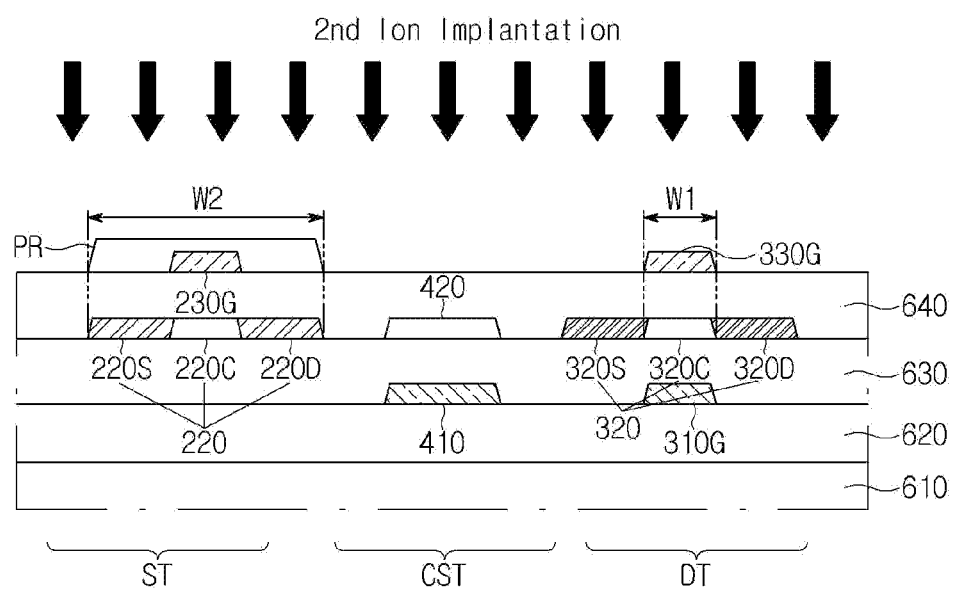

FIGS. 9 and 10 are diagrams for describing a method of producing the sub-pixel of FIG. 8.

First, referring to FIG. 9, a substrate 610 is provided, and a buffer layer 620 is formed on the substrate 610. A first electrode 410 and an auxiliary gate electrode 310G may be formed on the buffer layer 620. The auxiliary gate electrode 310G may not be selectively formed. The first electrode 410 and the auxiliary gate electrode 310G may be formed of the same material in the same process. A first interlayer insulating layer 630 may be formed on the first electrode 410 and the auxiliary gate electrode 310G. A first semiconductor pattern 220, a second electrode 420, and a second semiconductor pattern 320 may be formed on the first interlayer insulating layer 630. The first semiconductor pattern 220, the second electrode 420, and the second semiconductor pattern 320 may be made of the same material in the same process.

A gate insulating layer 640 may be formed on the first semiconductor pattern 220, the second electrode 420 and the second semiconductor pattern 320. The gate insulating layer 640 may be formed to have the same height at the first semiconductor pattern 220 and the second semiconductor pattern 320.

The first gate electrode 230G and the second gate electrode 330G may be formed on the gate insulating layer 640. The first gate electrode 230G, and the second gate electrode 330G may be formed of the same material in the same process.

Thereafter, a first ion implantation process may be performed. The ion implantation process is a process of physically implanting ions formed using a source gas into a semiconductor pattern. When an electric field is applied to charged ion particles to accelerate the ion particles toward the semiconductor pattern, dopant collides with the semiconductor pattern, and the ions are implanted into the semiconductor pattern. The depth at which the dopant is implanted may be controlled by adjusting acceleration energy, and the amount of dopant may be controlled by measuring an ion current.

Since the first gate electrode 230G is disposed over the first semiconductor pattern 220, dopant is not implanted into a portion overlapping the first gate electrode 230G, and thus the first channel region 220C is formed. The horizontal width W1 of the first semiconductor pattern 220 may be equal to the horizontal width W1 of the first channel region 220C. Dopant is implanted into one side portion that does not overlap the first gate electrode 230G, and thus, the first source region 220S is formed. Dopant is implanted into the other side portion that does not overlap the first gate electrode 230G, and thus, the first drain region 220D is formed.

Since the second gate electrode 330G is disposed over the second semiconductor pattern 320, dopant is not implanted into a portion overlapping the second gate electrode 330G, and thus, the second channel region 320C is formed. The horizontal width W1 of the second gate electrode 330G may be equal to the horizontal width W1 of the second channel region 320C. Therefore, the horizontal widths W1 of the first gate electrode 230G, the first channel region 220C, the second gate electrode 330G, and the second channel region 320C are all the same. Dopant is implanted into one side portion that does not overlap the second gate electrode 330G, and thus, the second source region 320S is formed. Dopant is implanted into the other side portion that does not overlap the second gate electrode 330G, and thus, the second drain region 320D is formed.

The dose of the first semiconductor pattern 220 formed by the first ion implantation process may be equal to the dose of the second semiconductor pattern 320 formed by the first ion implantation process.

Thereafter, a photoresist film PR may be formed on the first gate electrode 230G before a second ion implantation process is performed. The photoresist film PR may block accelerated ions. The horizontal width W2 of the photoresist film PR may be equal to or at least larger than the horizontal width W2 of the first semiconductor pattern 220.

The second ion implantation process is performed. The photoresist film PR is formed over the first semiconductor pattern 220 to prevent or at least reduce dopant from being permeated into the first semiconductor pattern 220. Accordingly, the dose of the first source region 220S and the dose of the first drain region 220D may be maintained Since the photoresist film PR is not formed over the second semiconductor pattern 320, dopant is permeated into the second semiconductor pattern 320. Accordingly, the dose of the second source region 320S and the dose of the second drain region 320D may increase.

According to the present embodiment, the dose implanted into the first semiconductor pattern 220 of the switching transistor ST is smaller than the dose implanted into the second semiconductor pattern 320 of the driving transistor DT. Conversely, the dose implanted into the second semiconductor pattern 320 of the driving transistor DT is larger than the dose implanted into the first semiconductor pattern 220 of the switching transistor ST.

Figure 11:
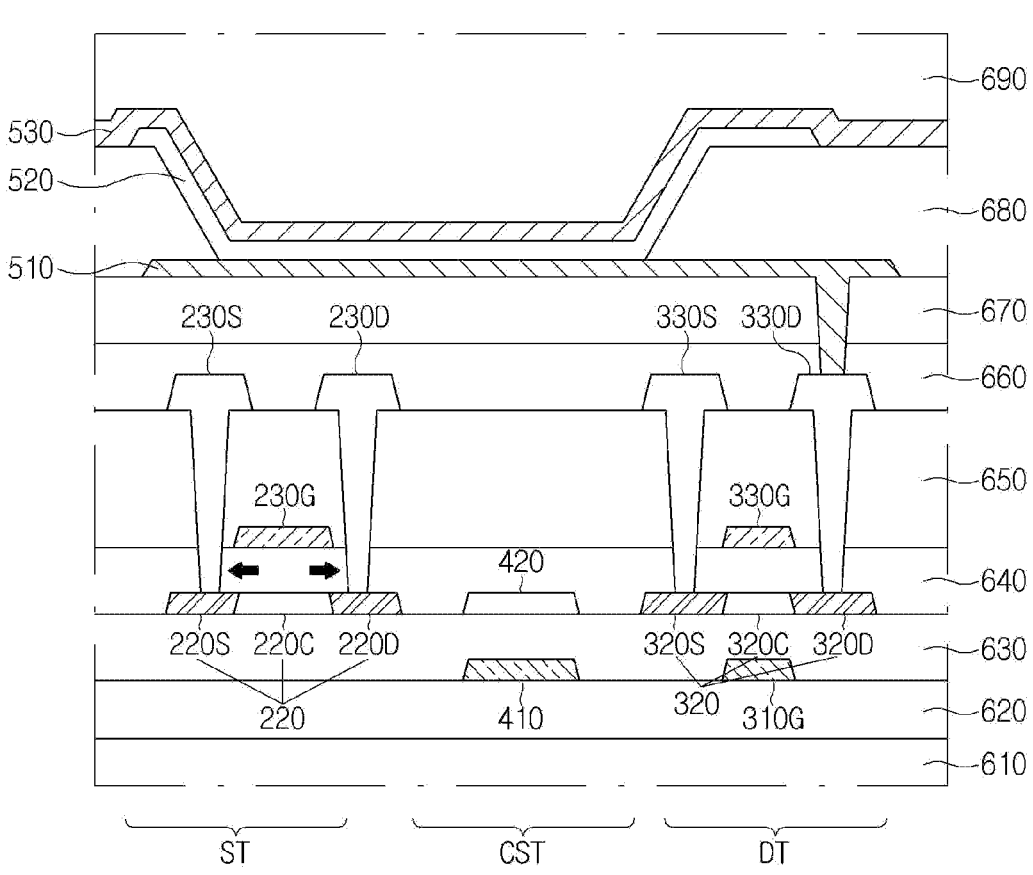
FIG. 11 is a cross-sectional view of a sub-pixel according to another embodiment of the present disclosure.

FIG. 11 is a cross-sectional view of a sub-pixel according to another embodiment of the present disclosure.

Unlike the embodiments described above with reference to FIGS. 4 and 6, in the present embodiment, a distance between the first gate electrode 230G and the first semiconductor pattern 220 is barely different from a distance between the second gate electrode 330G and the second semiconductor pattern 220.

Compared to the embodiment described above with reference to FIG. 8, in the present embodiment, the horizontal width of the second gate electrode 330G is reduced, and accordingly, the horizontal width of the second channel region 320C is also reduced. Referring to FIG. 11, a sub-pixel may include a switching transistor ST, a storage capacitor Cst, and a driving transistor DT.

The switching transistor ST may include a first semiconductor pattern 220, a first source electrode 230S, a first gate electrode 230G, and a first drain electrode 230D.

The first semiconductor pattern 220 may be formed on the first interlayer insulating layer 630. The first semiconductor pattern 220 may include a first source region 220S, a first channel region 220C, and a first drain region 220D. The first source region 220S is a region in contact with the first source electrode 230S. The first drain region 220D is a region that contacts the first drain electrode 230D. The first channel region 220C is a region between the first source region 220S and the first drain region 220D. As will be described later with reference to FIG. 12, the first gate electrode 230G may be disposed over the first semiconductor pattern 220 made of oxide, and thereafter, an ion implantation process may be performed. Since the first gate electrode 230G serves as a kind of mask, the center portion of the first semiconductor pattern 220 has no conductivity, but the left portion and the right portion of the first semiconductor pattern 220 have conductivity, thereby forming the first source region 220S and the first drain region 220D.

In the present embodiment, the first semiconductor pattern 220 may be an oxide semiconductor made of oxide. That is, the switching transistor ST may be an oxide semiconductor.

The first source electrode 230S may be formed on the second interlayer insulating layer 650. The first source electrode 230S may be electrically connected to the first source region 220S through a contact hole passing through the second interlayer insulating layer 650 and the gate insulating layer 640.

The first drain electrode 230D may be formed on the second interlayer insulating layer 650. The first drain electrode 230D may be electrically connected to the first drain region 220D through a contact hole passing through the second interlayer insulating layer 650 and the gate insulating layer 640.

The first gate electrode 230G may be formed on the gate insulating layer 640. When a signal is applied to the first gate electrode 230G, the first semiconductor pattern 220 is activated by the gate electrode 230G, and the signal applied to the first source electrode 230S may be transferred to the first drain electrode 230D by passing through the first semiconductor pattern 220. Since the first gate electrode 230G is positioned above the first semiconductor pattern 220, the above-described structure may be referred to as a top gate method. However, the first gate electrode 230G may be positioned under the first semiconductor pattern 220. For example, the first gate electrode 230G may be formed on the buffer layer 620. In this case, since the first gate electrode 230G is positioned under the first semiconductor pattern 220, the above-described structure may be referred to as a bottom gate method.

The first source electrode 230S, the first drain electrode 230D, and the first gate electrode 230G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the first source electrode 230S, the first drain electrode 230D, and the first gate electrode 230G may be formed as a single layer or multiple layers.

The storage capacitor CST may include a first electrode 410 and a second electrode 420. The first electrode 410 may be disposed on the buffer layer 620, and the second electrode 420 may be disposed on the first interlayer insulating layer 630. The second electrode 420 may be made of the same material as the semiconductor pattern 220 of the switching transistor ST in the same process. The first electrode 410 may be made of the same material as an auxiliary gate electrode 310G of the driving transistor DT in the same process. The first electrode 410 and the second electrode 420 may be spaced apart from each other.

The driving transistor DT may include a second semiconductor pattern 320, a second source electrode 330S, a second gate electrode 330G, and a second drain electrode 330D.

The second semiconductor pattern 320 may be disposed on the first interlayer insulating layer 630. The second semiconductor pattern 320 may include a second source region 320S, a second channel region 320C, and a second drain region 320D. The second source region 320S is a region that contacts the second source electrode 330S. The second drain region 320D is a region that contacts the second drain electrode 330D. The second channel region 320C is a region disposed between the second source region 320S and the second drain region 320D. As described below with reference to FIG. 12, the second gate electrode 330G may be disposed over the second semiconductor pattern 320 made of oxide, and thereafter, an ion implantation process may be performed. Since the second gate electrode 330G serves as a kind of mask, the center portion of the second semiconductor pattern 320 has no conductivity, but the left portion and the right portion of the second semiconductor pattern 320 have conductivity, thereby forming the second source region 320S and the second drain region 320D. The second semiconductor pattern 320 may be made of the same material as the first semiconductor pattern 220 in the same process.

Also, in the present embodiment, the horizontal width of the second channel region 320C may be formed narrower than that of the first channel region 220C.

According to the present embodiment, the second semiconductor pattern 320 may be an oxide semiconductor made of oxide. That is, the driving transistor DT may be an oxide semiconductor.

The second source electrode 330S may be formed on the second interlayer insulating layer 650. The second source electrode 330S may be electrically connected to the second source region 320S through a contact hole passing through the second interlayer insulating layer 650 and the gate insulating layer 640.

The second drain electrode 330D may be formed on the second interlayer insulating layer 650. The second drain electrode 330D may be electrically connected to the second drain region 320D through a contact hole passing through the second interlayer insulating layer 650 and the gate insulating layer 640.

The second source electrode 330S and the second drain electrode 330D may be made of the same material as the first source electrode 230S and the first drain electrode 230D in the same process.

The second gate electrode 330G may be formed on the gate insulating layer 640. When a signal is applied to the second gate electrode 330G, the second semiconductor pattern 320 may be activated by the gate electrode 330G, and the signal applied to the second source electrode 330S may be transferred to the second drain electrode 330D by passing through the second semiconductor pattern 320. Since the second gate electrode 330G is positioned above the second semiconductor pattern 320, the above-described structure may be referred to as a top gate method. It is noted that the second gate electrode 330G may be positioned under the second semiconductor pattern 320. For example, the second gate electrode 330G may be formed on the buffer layer 620. In this case, since the second gate electrode 330G is positioned under the second semiconductor pattern 320, the above-described structure may be referred to as a bottom gate method.

The second source electrode 330S, the second drain electrode 330D, and the second gate electrode 330G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the second source electrode 330S, the second drain electrode 330D, and the second gate electrode 330G may be formed as a single layer or multiple layers.

Additionally, the driving transistor DT may further include an auxiliary gate electrode 310G. The auxiliary gate electrode 310G may be formed on the buffer layer 620. When the driving transistor DT includes both the second gate electrode 320G and the auxiliary gate electrode 310G, the driving transistor DT may be driven in a so-called double gate method including two gate electrodes.

According to the present embodiment, the horizontal width of the second gate electrode 330G may be formed narrower than the horizontal width of the first gate electrode 230G. Also, the horizontal width of the second channel region 320C may be formed narrower than that of the first channel region 220C.

According to the present embodiment, the total dose of the first semiconductor pattern 220 may be different from the total dose of the second semiconductor pattern 320. The dose may refer to the amount of dopant implanted into the surface of the semiconductor pattern for one second per one square centimeter in an ion implantation process. The total dose amount of the second semiconductor pattern 320 may be larger than the total dose amount of the first semiconductor pattern 220. The total dose may refer to, for example, a total dose relative to the entire area of a semiconductor pattern. In the present embodiment, the channel region 220C of the first semiconductor pattern 220 may be wider than the channel region 320C of the second semiconductor pattern 320. Accordingly, the areas of the first source region 220S and the first drain region 220D, which are doped with dopant, may be narrower than those of the second source region 320S and the second drain region 320D. Accordingly, the total dose of the second semiconductor pattern 320 may be larger than the total dose of the first semiconductor pattern 220. In other words, the total dose of the driving transistor DT may be larger than the total dose of the switching transistor ST. For example, when the total dose of the first semiconductor pattern 220 is referred to as a first dose and the dose of the second semiconductor pattern 320 is referred to as a second dose, the second dose may be larger than the first dose.

According to the present embodiment, a difference between the total dose of the first semiconductor pattern 220 and the total dose of the second semiconductor pattern 320 may imply the following technical meaning. A driving transistor DT and a switching transistor ST are disposed in a sub-pixel. Both the driving transistor DT and the switching transistor ST include an oxide semiconductor. Since the transistors in the sub-pixel include semiconductors of the same type (oxide), the transistors may be produced in the same process, thus improving productivity and reducing manufacturing costs. However, since the driving transistor DT and the switching transistor ST have different functions, required device performances are also different. For example, the driving transistor DT and the switching transistor ST are different in device performances such as threshold voltage, on-current, off-current, charge mobility or the like. However, when the transistors are fabricated as the same type in the same process, the driving transistor DT and the switching transistor ST may have the same device performance According to the present disclosure, the driving transistor DT and the switching transistor ST are fabricated as the same type in the same process, but the first semiconductor pattern 220 and the second semiconductor pattern 320 are different in total dose. Therefore, the driving transistor DT and the switching transistor ST may have different device performance.

Figure 12:
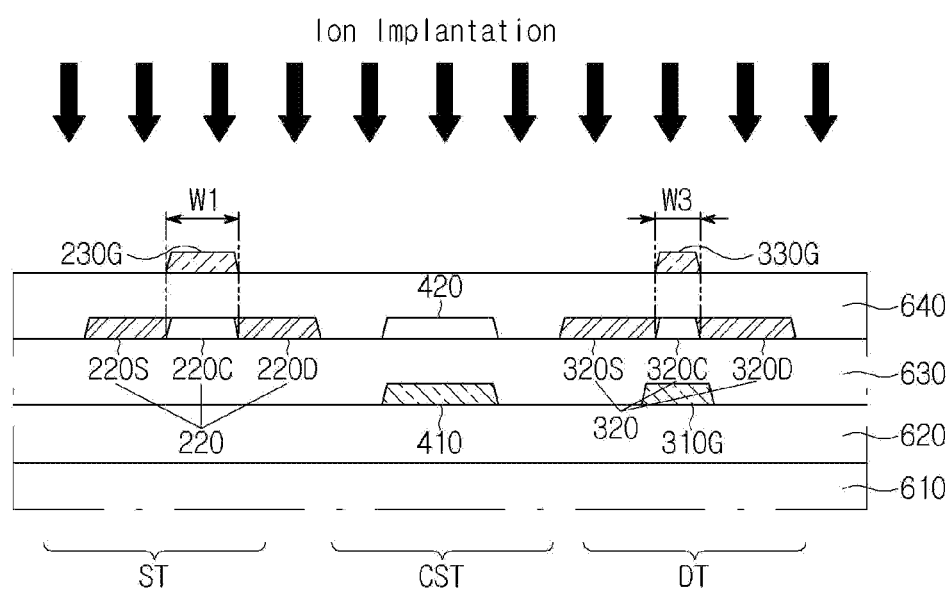
FIG. 12 is a diagram for describing a method of producing the sub-pixel of FIG. 11 according to an embodiment of the present disclosure.

FIG. 12 is a diagram for describing a method of producing the sub-pixel of FIG. 11 in accordance with one embodiment.

Referring to FIG. 12, a substrate 610 is provided and a buffer layer 620 is formed on the substrate 610. A first electrode 410 and an auxiliary gate electrode 310G may be formed on the buffer layer 620. The auxiliary gate electrode 310G may not be selectively formed. The first electrode 410 and the auxiliary gate electrode 310G may be formed of the same material in the same process. A first interlayer insulating layer 630 may be formed on the first electrode 410 and the auxiliary gate electrode 310G. A first semiconductor pattern 220, a second electrode 420, and a second semiconductor pattern 320 may be formed on the first interlayer insulating layer 630. The first semiconductor pattern 220, the second electrode 420, and the second semiconductor pattern 320 may be made of the same material in the same process.

A gate insulating layer 640 may be formed on the first semiconductor pattern 220, the second electrode 420 and the second semiconductor pattern 320. The gate insulating layer 640 may be formed to have the same height at the first semiconductor pattern 220 and the second semiconductor pattern 320.

The first gate electrode 230G and the second gate electrode 330G may be formed on the gate insulating layer 640. The first gate electrode 230G and the second gate electrode 330G may be formed of the same material in the same process.

According to the present embodiment, the horizontal width W1 of the first gate electrode 230G may be formed wider than the horizontal width W3 of the second gate electrode 330G. Conversely, the horizontal width W3 of the second gate electrode 330G may be formed narrower than the horizontal width W1 of the first gate electrode 230G.

Thereafter, an ion implantation process may be performed. The ion implantation process is a process of physically implanting ions formed using a source gas into a semiconductor pattern. When an electric field is applied to charged ion particles to accelerate the ion particles toward the semiconductor pattern, dopant collides with the semiconductor pattern and the ions are implanted into the semiconductor pattern. The depth at which the dopant is implanted may be controlled by adjusting acceleration energy, and the amount of dopant may be controlled by measuring an ion current.

Since the first gate electrode 230G is disposed over the first semiconductor pattern 220, dopant is not implanted into a portion overlapping the first gate electrode 230G, and thus the first channel region 220C is formed. The horizontal width W1 of the first semiconductor pattern 220 may be equal to the horizontal width W1 of the first channel region 220C. Dopant is implanted into one side portion that does not overlap the first gate electrode 230G, and thus, the first source region 220S is formed. Dopant is implanted into the other side portion that does not overlap the first gate electrode 230G, and thus, the first drain region 220D is formed.

Since the second gate electrode 330G is disposed over the second semiconductor pattern 320, dopant is not implanted into a portion overlapping the second gate electrode 330G, and thus, the second channel region 320C is formed. Dopant is implanted into one side portion that does not overlap the second gate electrode 330G, and thus, the second source region 320S is formed. Dopant is implanted into the other side portion that does not overlap the second gate electrode 330G, and thus, the second drain region 320D is formed.

According to the present embodiment, the horizontal width W3 of the second gate electrode 330G may be equal to the horizontal width W3 of the second channel region 320C. The horizontal width W3 of the second gate electrode 330G may be narrower than the horizontal width W1 of the first gate electrode 230G. The horizontal width W3 of the second channel region 320C may be narrower than the horizontal width W1 of the first channel region 220C.

According to the present embodiment, the total dose of the first semiconductor pattern 220 formed by the ion implantation process may be smaller than the total dose of the second semiconductor pattern 320. Conversely, the total dose of the second semiconductor pattern 320 may be larger than the total dose of the first semiconductor pattern 220.

Figure 13:
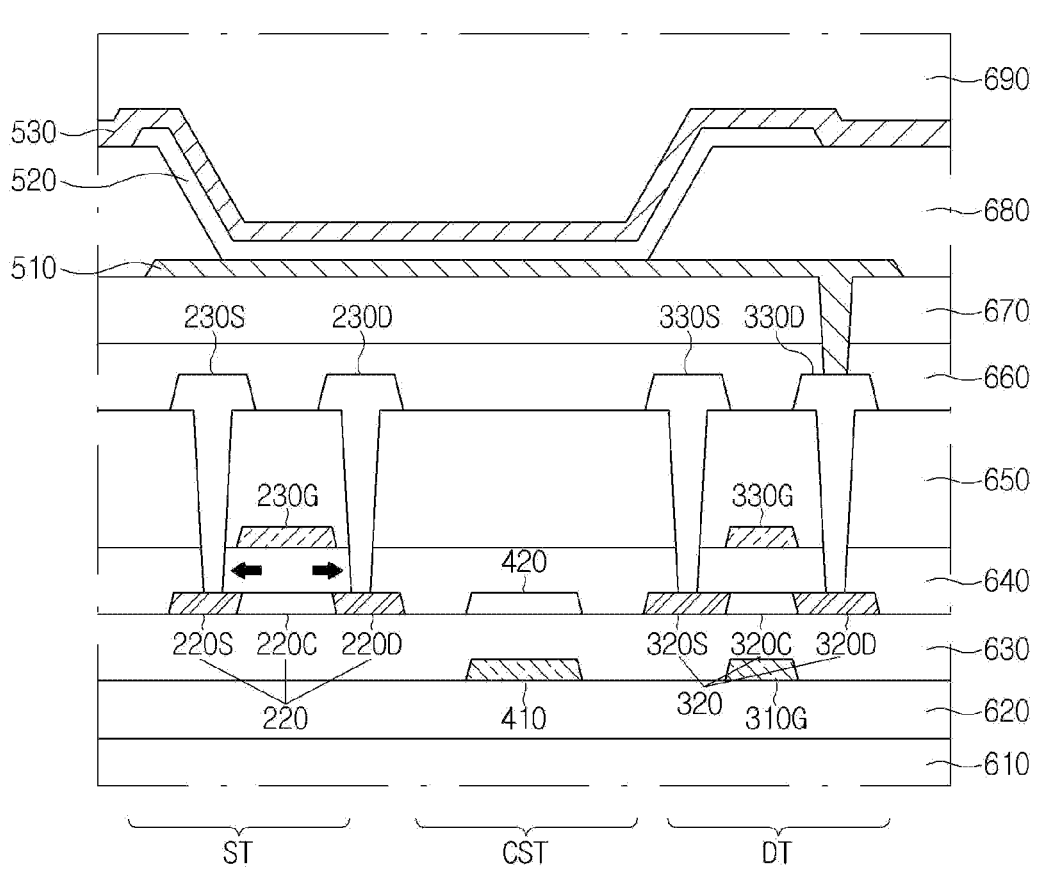
FIG. 13 is a cross-sectional view of a sub-pixel according to another embodiment of the present disclosure.

FIG. 13 is a cross-sectional view of a sub-pixel according to another embodiment of the present disclosure.

Unlike the embodiments described above with reference to FIGS. 4 and 6, in the present embodiment, a distance between the first gate electrode 230G and the first semiconductor pattern 220 is barely different from a distance between the second gate electrode 330G and the second semiconductor pattern 220.

Compared to the embodiment described above with reference to FIG. 8, in the present embodiment, the horizontal width of the first gate electrode 230G is increased, and accordingly, the horizontal width of the first channel region 320C is also increased.

Referring to FIG. 13, a sub-pixel may include a switching transistor ST, a storage capacitor Cst, and a driving transistor DT.

The switching transistor ST may include a first semiconductor pattern 220, a first source electrode 230S, a first gate electrode 230G, and a first drain electrode 230D.

The first semiconductor pattern 220 may be formed on the first interlayer insulating layer 630. The first semiconductor pattern 220 may include a first source region 220S, a first channel region 220C, and a first drain region 220D. The first source region 220S is a region in contact with the first source electrode 230S. The first drain region 220D is a region that contacts the first drain electrode 230D. The first channel region 220C is a region between the first source region 220S and the first drain region 220D. As will be described later with reference to FIG. 14, the first gate electrode 230G may be disposed over the first semiconductor pattern 220 made of oxide, and thereafter, an ion implantation process may be performed. Since the first gate electrode 230G serves as a kind of mask, the center portion of the first semiconductor pattern 220 has no conductivity, but the left portion and the right portion of the first semiconductor pattern 220 have conductivity, thereby forming the first source region 220S and the first drain region 220D.

According to the present embodiment, the horizontal width of the first channel region 220C may be wider than the horizontal width of the second channel region 330C.

In the present embodiment, the first semiconductor pattern 220 may be an oxide semiconductor made of oxide. That is, the switching transistor ST may be an oxide semiconductor.

The first source electrode 230S may be formed on the second interlayer insulating layer 650. The first source electrode 230S may be electrically connected to the first source region 220S through a contact hole passing through the second interlayer insulating layer 650 and the gate insulating layer 640.

The first drain electrode 230D may be formed on the second interlayer insulating layer 650. The first drain electrode 230D may be electrically connected to the first drain region 220D through a contact hole passing through the second interlayer insulating layer 650 and the gate insulating layer 640.

The first gate electrode 230G may be formed on the gate insulating layer 640. When a signal is applied to the first gate electrode 230G, the first semiconductor pattern 220 is activated by the gate electrode 230G, and the signal applied to the first source electrode 230S may be transferred to the first drain electrode 230D by passing through the first semiconductor pattern 220. Since the first gate electrode 230G is positioned above the first semiconductor pattern 220, the above-described structure may be referred to as a top gate method. However, the first gate electrode 230G may be positioned under the first semiconductor pattern 220. For example, the first gate electrode 230G may be formed on the buffer layer 620. In this case, since the first gate electrode 230G is positioned under the first semiconductor pattern 220, the above-described structure may be referred to as a bottom gate method.

According to the present embodiment, the horizontal width of the first gate electrode 230G may be wider than the horizontal width of the second gate electrode 330G. Accordingly, the horizontal width of the first channel region 220C may be wider than the horizontal width of the second channel region 320C.

The first source electrode 230S, the first drain electrode 230D, and the first gate electrode 230G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the first source electrode 230S, the first drain electrode 230D, and the first gate electrode 230G may be formed as a single layer or multiple layers.

The storage capacitor CST may include a first electrode 410 and a second electrode 420. The first electrode 410 may be disposed on the buffer layer 620, and the second electrode 420 may be disposed on the first interlayer insulating layer 630. The second electrode 420 may be made of the same material as the semiconductor pattern 220 of the switching transistor ST in the same process. The first electrode 410 may be made of the same material as an auxiliary gate electrode 310G of the driving transistor DT in the same process. The first electrode 410 and the second electrode 420 may be spaced apart from each other. The driving transistor DT may include a second semiconductor pattern 320, a second source electrode 330S, a second gate electrode 330G, and a second drain electrode 330D.

The second semiconductor pattern 320 may be disposed on the first interlayer insulating layer 630. The second semiconductor pattern 320 may include a second source region 320S, a second channel region 320C, and a second drain region 320D. The second source region 320S is a region that contacts the second source electrode 330S. The second drain region 320D is a region that contacts the second drain electrode 330D. The second channel region 320C is a region disposed between the second source region 320S and the second drain region 320D. As described below with reference to FIG. 12, the second gate electrode 330G may be disposed over the second semiconductor pattern 320 made of oxide, and thereafter, an ion implantation process may be performed. Since the second gate electrode 330G serves as a kind of mask, the center portion of the second semiconductor pattern 320 has no conductivity, but the left portion and the right portion of the second semiconductor pattern 320 have conductivity, thereby forming the second source region 320S and the second drain region 320D. The second semiconductor pattern 320 may be made of the same material as the first semiconductor pattern 220 in the same process.

According to the present embodiment, the second semiconductor pattern 320 may be an oxide semiconductor made of oxide. That is, the driving transistor DT may be an oxide semiconductor.

The second source electrode 330S may be formed on the second interlayer insulating layer 650. The second source electrode 330S may be electrically connected to the second source region 320S through a contact hole passing through the second interlayer insulating layer 650 and the gate insulating layer 640.

The second drain electrode 330D may be formed on the second interlayer insulating layer 650. The second drain electrode 330D may be electrically connected to the second drain region 320D through a contact hole passing through the second interlayer insulating layer 650 and the gate insulating layer 640.

The second source electrode 330S and the second drain electrode 330D may be made of the same material as the first source electrode 230S and the first drain electrode 230D in the same process.

The second gate electrode 330G may be formed on the gate insulating layer 640. When a signal is applied to the second gate electrode 330G, the second semiconductor pattern 320 may be activated by the gate electrode 330G, and the signal applied to the second source electrode 330S may be transferred to the second drain electrode 330D by passing through the second semiconductor pattern 320. Since the second gate electrode 330G is positioned above the second semiconductor pattern 320, the above-described structure may be referred to as a top gate method. It is noted that the second gate electrode 330G may be positioned under the second semiconductor pattern 320. For example, the second gate electrode 330G may be formed on the buffer layer 620. In this case, since the second gate electrode 330G is positioned under the second semiconductor pattern 320, the above-described structure may be referred to as a bottom gate method.

The second source electrode 330S, the second drain electrode 330D, and the second gate electrode 330G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the second source electrode 330S, the second drain electrode 330D, and the second gate electrode 330G may be formed as a single layer or multiple layers.

Additionally, the driving transistor DT may further include an auxiliary gate electrode 310G. The auxiliary gate electrode 310G may be formed on the buffer layer 620. When the driving transistor DT includes both the second gate electrode 320G and the auxiliary gate electrode 310G, the driving transistor DT may be driven in a so-called double gate method including two gate electrodes.

According to the present embodiment, the horizontal width of the first gate electrode 230G may be wider than the horizontal width of the second gate electrode 330G. Also, the horizontal width of the first channel region 220C may be wider than the horizontal width of the second channel region 320C.

According to the present embodiment, the total dose of the first semiconductor pattern 220 may be different from the total dose of the second semiconductor pattern 320. The dose may refer to the amount of dopant implanted into the surface of the semiconductor pattern for one second per one square centimeter in an ion implantation process. The total dose amount of the second semiconductor pattern 320 may be larger than the total dose amount of the first semiconductor pattern 220. The total dose may refer to, for example, a total dose relative to the entire area of a semiconductor pattern. In the present embodiment, the channel region 220C of the first semiconductor pattern 220 may be wider than the channel region 320C of the second semiconductor pattern 320. Accordingly, the areas of the first source region 220S and the first drain region 220D, which are doped with dopant, may be narrower than those of the second source region 320S and the second drain region 320D. Accordingly, the total dose of the second semiconductor pattern 320 may be larger than the total dose of the first semiconductor pattern 220. In other words, the total dose of the driving transistor DT may be larger than the total dose of the switching transistor ST. For example, when the total dose of the first semiconductor pattern 220 is referred to as a first dose and the dose of the second semiconductor pattern 320 is referred to as a second dose, the second dose may be larger than the first dose.

According to the present embodiment, a difference between the total dose of the first semiconductor pattern 220 and the total dose of the second semiconductor pattern 320 may imply the following technical meaning. A driving transistor DT and a switching transistor ST are disposed in a sub-pixel. Both the driving transistor DT and the switching transistor ST include an oxide semiconductor. Since the transistors in the sub-pixel include semiconductors of the same type (oxide), the transistors may be produced in the same process, thus improving productivity and reducing manufacturing costs. However, since the driving transistor DT and the switching transistor ST have different functions, required device performances are also different. For example, the driving transistor DT and the switching transistor ST are different in device performances such as threshold voltage, on-current, off-current, charge mobility or the like. However, when the transistors are fabricated as the same type in the same process, the driving transistor DT and the switching transistor ST may have the same device performance According to the present disclosure, the driving transistor DT and the switching transistor ST are fabricated as the same type in the same process, but the first semiconductor pattern 220 and the second semiconductor pattern 320 are different in total dose. Therefore, the driving transistor DT and the switching transistor ST may have different device performance.

Figure 14:
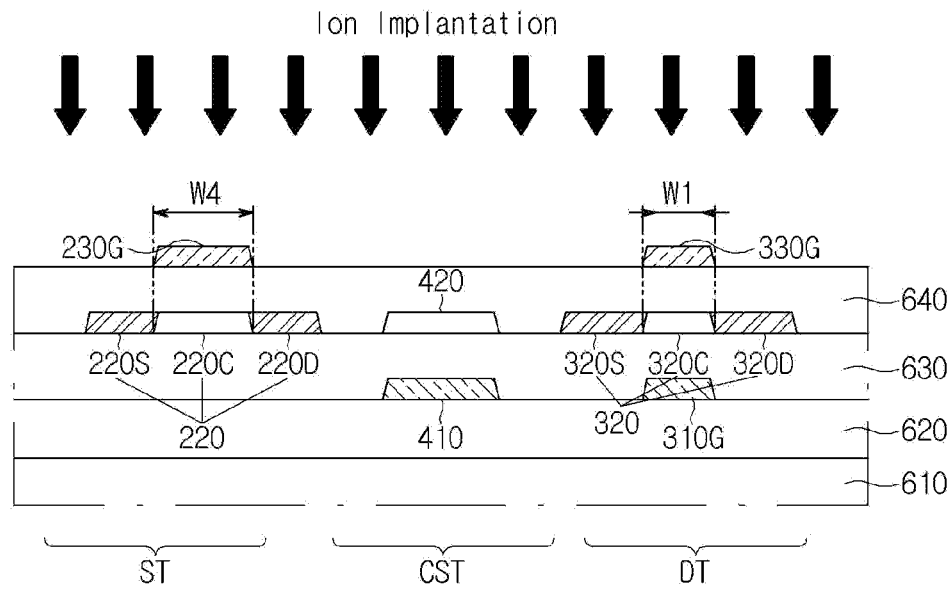
FIG. 14 is a diagram for describing a method of producing the sub-pixel of FIG. 13 according to an embodiment of the present disclosure.

FIG. 14 is a diagram for describing a method of producing the sub-pixel of FIG. 13 in accordance with one embodiment.

Referring to FIG. 14, a substrate 610 is provided, and a buffer layer 620 is formed on the substrate 610. A first electrode 410 and an auxiliary gate electrode 310G may be formed on the buffer layer 620. The auxiliary gate electrode 310G may not be selectively formed. The first electrode 410 and the auxiliary gate electrode 310G may be formed of the same material in the same process. A first interlayer insulating layer 630 may be formed on the first electrode 410 and the auxiliary gate electrode 310G. A first semiconductor pattern 220, a second electrode 420, and a second semiconductor pattern 320 may be formed on the first interlayer insulating layer 630. The first semiconductor pattern 220, the second electrode 420, and the second semiconductor pattern 320 may be made of the same material in the same process.

A gate insulating layer 640 may be formed on the first semiconductor pattern 220, the second electrode 420 and the second semiconductor pattern 320. The gate insulating layer 640 may be formed to have the same height at the first semiconductor pattern 220 and the second semiconductor pattern 320.

The first gate electrode 230G and the second gate electrode 330G may be formed on the gate insulating layer 640. The first gate electrode 230G and the second gate electrode 330G may be formed of the same material in the same process.

According to the present embodiment, the horizontal width W4 of the first gate electrode 230G may be formed wider than the horizontal width W1 of the second gate electrode 330G. Conversely, the horizontal width W1 of the second gate electrode 330G may be formed narrower than the horizontal width W4 of the first gate electrode 230G.

Thereafter, an ion implantation process may be performed. The ion implantation process is a process of physically implanting ions formed using a source gas into a semiconductor pattern. When an electric field is applied to charged ion particles to accelerate the ion particles toward the semiconductor pattern, dopant collides with the semiconductor pattern, and the ions are implanted into the semiconductor pattern. The depth at which the dopant is implanted may be controlled by adjusting acceleration energy, and the amount of dopant may be controlled by measuring an ion current.

Since the first gate electrode 230G is disposed over the first semiconductor pattern 220, dopant is not implanted into a portion overlapping the first gate electrode 230G, and thus the first channel region 220C is formed. The horizontal width W1 of the first semiconductor pattern 220 may be equal to the horizontal width W1 of the first channel region 220C. Dopant is implanted into one side portion that does not overlap the first gate electrode 230G, and thus, the first source region 220S is formed. Dopant is implanted into the other side portion that does not overlap the first gate electrode 230G, and thus, the first drain region 220D is formed.

Since the second gate electrode 330G is disposed over the second semiconductor pattern 320, dopant is not implanted into a portion overlapping the second gate electrode 330G and thus, the second channel region 320C is formed. Dopant is implanted into one side portion that does not overlap the second gate electrode 330G, and thus, the second source region 320S is formed. Dopant is implanted into the other side portion that does not overlap the second gate electrode 330G, and thus, the second drain region 320D is formed.

According to the present embodiment, the horizontal width W1 of the second gate electrode 330G may be equal to the horizontal width W1 of the second channel region 320C. The horizontal width W1 of the second gate electrode 330G may be narrower than the horizontal width W4 of the first gate electrode 230G. The horizontal width W1 of the second channel region 320C may be narrower than the horizontal width W4 of the first channel region 220C.

According to the present embodiment, the total dose of the first semiconductor pattern 220 formed by the ion implantation process may be smaller than the total dose of the second semiconductor pattern 320. Conversely, the total dose of the second semiconductor pattern 320 may be larger than the total dose of the first semiconductor pattern 220.

Figure 15:
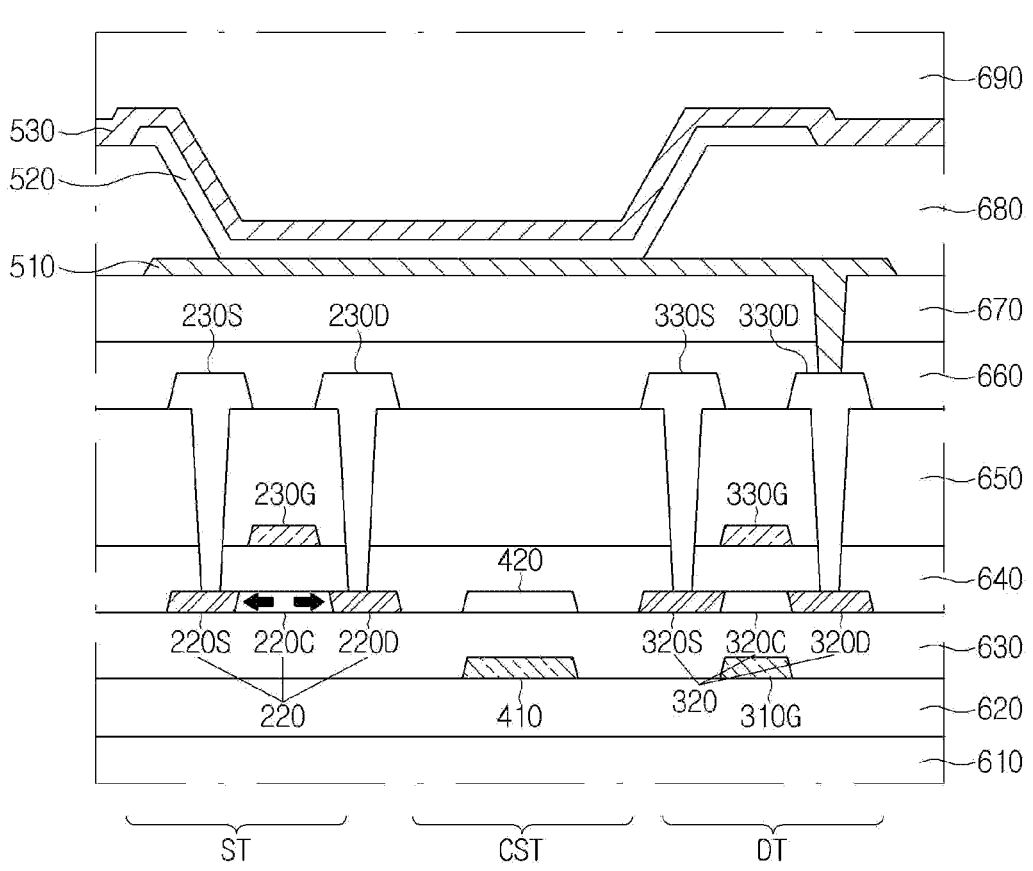
FIG. 15 is a cross-sectional view of a sub-pixel according to another embodiment of the present disclosure.

FIG. 15 is a cross-sectional view of a sub-pixel according to another embodiment of the present disclosure.

Unlike the embodiments described above with reference to FIGS. 4 and 6, in the present embodiment, a distance between the first gate electrode 230G and the first semiconductor pattern 220 is barely different from a distance between the second gate electrode 330G and the second semiconductor pattern 220.

Compared to the embodiments described above with reference to FIGS. 11 and 13, in the present embodiment, the horizontal width of the first gate electrode 230G may be equal to the horizontal width of the second gate electrode 330G. However, the horizontal width of the first channel region 220C may be wider than the horizontal width of the second channel region 320C.

Referring to FIG. 15, a sub-pixel may include a switching transistor ST, a storage capacitor Cst, and a driving transistor DT.

The switching transistor ST may include a first semiconductor pattern 220, a first source electrode 230S, a first gate electrode 230G, and a first drain electrode 230D.

The first semiconductor pattern 220 may be formed on the first interlayer insulating layer 630. The first semiconductor pattern 220 may include a first source region 220S, a first channel region 220C, and a first drain region 220D. The first source region 220S is a region in contact with the first source electrode 230S. The first drain region 220D is a region that contacts the first drain electrode 230D. The first channel region 220C is a region between the first source region 220S and the first drain region 220D. As will be described later with reference to FIG. 16, the first gate electrode 230G may be disposed over the first semiconductor pattern 220 made of oxide, and thereafter, an ion implantation process may be performed. Since the first gate electrode 230G serves as a kind of mask, the center portion of the first semiconductor pattern 220 has no conductivity, but the left portion and the right portion of the first semiconductor pattern 220 have conductivity, thereby forming the first source region 220S and the first drain region 220D.

According to the present embodiment, the horizontal width of the first channel region 220C may be wider than the horizontal width of the second channel region 320C.

In the present embodiment, the first semiconductor pattern 220 may be an oxide semiconductor made of oxide. That is, the switching transistor ST may be an oxide semiconductor.

The first source electrode 230S may be formed on the second interlayer insulating layer 650. The first source electrode 230S may be electrically connected to the first source region 220S through a contact hole passing through the second interlayer insulating layer 650 and the gate insulating layer 640.

The first drain electrode 230D may be formed on the second interlayer insulating layer 650. The first drain electrode 230D may be electrically connected to the first drain region 220D through a contact hole passing through the second interlayer insulating layer 650 and the gate insulating layer 640.

The first gate electrode 230G may be formed on the gate insulating layer 640. When a signal is applied to the first gate electrode 230G, the first semiconductor pattern 220 is activated by the gate electrode 230G, and the signal applied to the first source electrode 230S may be transferred to the first drain electrode 230D by passing through the first semiconductor pattern 220. Since the first gate electrode 230G is positioned above the first semiconductor pattern 220, the above-described structure may be referred to as a top gate method. However, the first gate electrode 230G may be positioned under the first semiconductor pattern 220. For example, the first gate electrode 230G may be formed on the buffer layer 620. In this case, since the first gate electrode 230G is positioned under the first semiconductor pattern 220, the above-described structure may be referred to as a bottom gate method.

According to the present embodiment, the horizontal width of the first gate electrode 230G may be equal to the horizontal width of the second gate electrode 330G. However, the horizontal width of the first channel region 220C may be formed wider than the horizontal width of the second channel region 320C.

The first source electrode 230S, the first drain electrode 230D, and the first gate electrode 230G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the first source electrode 230S, the first drain electrode 230D, and the first gate electrode 230G may be formed as a single layer or multiple layers.

The storage capacitor CST may include a first electrode 410 and a second electrode 420. The first electrode 410 may be disposed on the buffer layer 620, and the second electrode 420 may be disposed on the first interlayer insulating layer 630. The second electrode 420 may be made of the same material as the semiconductor pattern 220 of the switching transistor ST in the same process. The first electrode 410 may be made of the same material as an auxiliary gate electrode 310G of the driving transistor DT in the same process. The first electrode 410 and the second electrode 420 may be spaced apart from each other.

The driving transistor DT may include a second semiconductor pattern 320, a second source electrode 330S, a second gate electrode 330G, and a second drain electrode 330D.

The second semiconductor pattern 320 may be disposed on the first interlayer insulating layer 630. The second semiconductor pattern 320 may include a second source region 320S, a second channel region 320C, and a second drain region 320D. The second source region 320S is a region that contacts the second source electrode 330S. The second drain region 320D is a region that contacts the second drain electrode 330D. The second channel region 320C is a region disposed between the second source region 320S and the second drain region 320D. As described below with reference to FIG. 16, the second gate electrode 330G may be disposed over the second semiconductor pattern 320 made of oxide, and thereafter, an ion implantation process may be performed. Since the second gate electrode 330G serves as a kind of mask, the center portion of the second semiconductor pattern 320 has no conductivity, but the left portion and the right portion of the second semiconductor pattern 320 have conductivity, thereby forming the second source region 320S and the second drain region 320D. The second semiconductor pattern 320 may be made of the same material as the first semiconductor pattern 220 in the same process.

According to the present embodiment, the second semiconductor pattern 320 may be an oxide semiconductor made of oxide. That is, the driving transistor DT may be an oxide semiconductor.

The second source electrode 330S may be formed on the second interlayer insulating layer 650. The second source electrode 330S may be electrically connected to the second source region 320S through a contact hole passing through the second interlayer insulating layer 650 and the gate insulating layer 640.

The second drain electrode 330D may be formed on the second interlayer insulating layer 650. The second drain electrode 330D may be electrically connected to the second drain region 320D through a contact hole passing through the second interlayer insulating layer 650 and the gate insulating layer 640.

The second source electrode 330S and the second drain electrode 330D may be made of the same material as the first source electrode 230S and the first drain electrode 230D in the same process.

The second gate electrode 330G may be formed on the gate insulating layer 640. When a signal is applied to the second gate electrode 330G, the second semiconductor pattern 320 may be activated by the gate electrode 330G, and the signal applied to the second source electrode 330S may be transferred to the second drain electrode 330D by passing through the second semiconductor pattern 320. Since the second gate electrode 330G is positioned above the second semiconductor pattern 320, the above-described structure may be referred to as a top gate method. It is noted that the second gate electrode 330G may be positioned under the second semiconductor pattern 320. For example, the second gate electrode 330G may be formed on the buffer layer 620. In this case, since the second gate electrode 330G is positioned under the second semiconductor pattern 320, the above-described structure may be referred to as a bottom gate method.

The second source electrode 330S, the second drain electrode 330D, and the second gate electrode 330G may include one of molybdenum (Mo), aluminum (Al), chromium (Cr), gold (Au), titanium (Ti), or nickel. (Ni), neodymium (Nd), and copper (Cu) or an alloy thereof. However, the present disclosure is not limited to such materials. Also, the second source electrode 330S, the second drain electrode 330D, and the second gate electrode 330G may be formed as a single layer or multiple layers.

Additionally, the driving transistor DT may further include an auxiliary gate electrode 310G. The auxiliary gate electrode 310G may be formed on the buffer layer 620. When the driving transistor DT includes both the second gate electrode 320G and the auxiliary gate electrode 310G, the driving transistor DT may be driven in a so-called double gate method including two gate electrodes.

According to the present embodiment, the horizontal width of the first gate electrode 230G may be formed equal to the horizontal width of the second gate electrode 330G. However, the horizontal width of the first channel region 220C may be formed wider than the horizontal width of the second channel region 320C.

According to the present embodiment, the total dose of the first semiconductor pattern 220 may be different from the total dose of the second semiconductor pattern 320. The dose may refer to the amount of dopant implanted into the surface of the semiconductor pattern for one second per one square centimeter in an ion implantation process. The total dose amount of the second semiconductor pattern 320 may be larger than the total dose amount of the first semiconductor pattern 220. The total dose may refer to, for example, a total dose relative to the entire area of a semiconductor pattern. In the present embodiment, the channel region 220C of the first semiconductor pattern 220 may be wider than the channel region 320C of the second semiconductor pattern 320. Accordingly, the areas of the first source region 220S and the first drain region 220D, which are doped with dopant, may be narrower than those of the second source region 320S and the second drain region 320D. Accordingly, the total dose of the second semiconductor pattern 320 may be larger than the total dose of the first semiconductor pattern 220. In other words, the total dose of the driving transistor DT may be larger than the total dose of the switching transistor ST. For example, when the total dose of the first semiconductor pattern 220 is referred to as a first dose and the dose of the second semiconductor pattern 320 is referred to as a second dose, the second dose may be larger than the first dose.

According to the present embodiment, a difference between the total dose of the first semiconductor pattern 220 and the total dose of the second semiconductor pattern 320 may imply the following technical meaning. A driving transistor DT and a switching transistor ST are disposed in a sub-pixel. Both the driving transistor DT and the switching transistor ST include an oxide semiconductor. Since the transistors in the sub-pixel include semiconductors of the same type (oxide), the transistors may be produced in the same process, thus improving productivity and reducing manufacturing costs. However, since the driving transistor DT and the switching transistor ST have different functions, required device performances are also different. For example, the driving transistor DT and the switching transistor ST are different in device performances such as threshold voltage, on-current, off-current, charge mobility or the like. However, when the transistors are fabricated as the same type in the same process, the driving transistor DT and the switching transistor ST may have the same device performance According to the present disclosure, the driving transistor DT and the switching transistor ST are fabricated as the same type in the same process, but the first semiconductor pattern 220 and the second semiconductor pattern 320 are different in total dose. Therefore, the driving transistor DT and the switching transistor ST may have different device performance.

Figure 16:
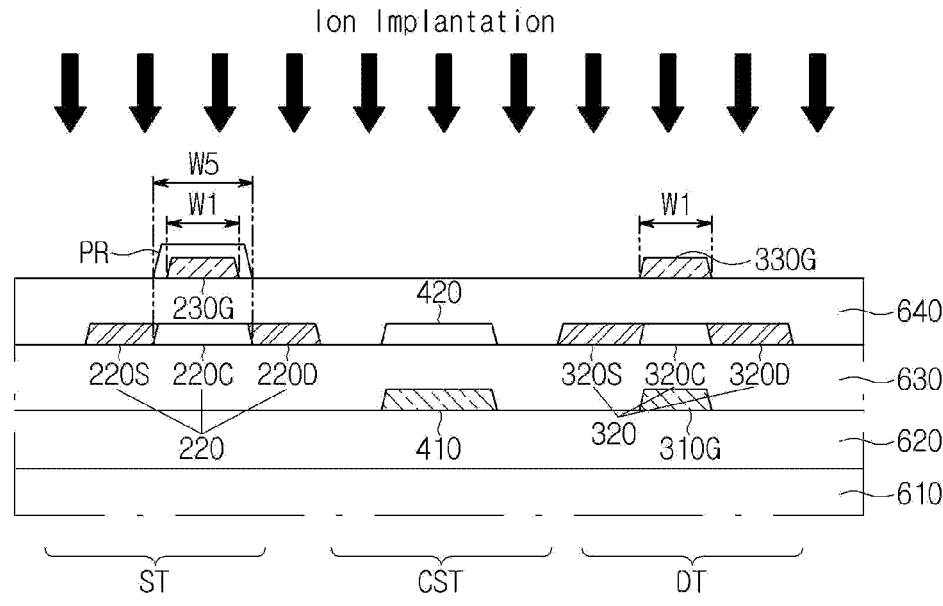
FIG. 16 is a diagram for describing a method of producing the sub-pixel of FIG. 15 according to an embodiment of the present disclosure.

FIG. 16 is a diagram for describing a method of producing the sub-pixel of FIG. 15.

Referring to FIG. 16, a substrate 610 is provided and a buffer layer 620 is formed on the substrate 610. A first electrode 410 and an auxiliary gate electrode 310G may be formed on the buffer layer 620. The auxiliary gate electrode 310G may not be selectively formed. The first electrode 410 and the auxiliary gate electrode 310G may be formed of the same material in the same process. A first interlayer insulating layer 630 may be formed on the first electrode 410 and the auxiliary gate electrode 310G. A first semiconductor pattern 220, a second electrode 420, and a second semiconductor pattern 320 may be formed on the first interlayer insulating layer 630. The first semiconductor pattern 220, the second electrode 420, and the second semiconductor pattern 320 may be made of the same material in the same process.

A gate insulating layer 640 may be formed on the first semiconductor pattern 220, the second electrode 420 and the second semiconductor pattern 320. The gate insulating layer 640 may be formed to have the same height at the first semiconductor pattern 220 and the second semiconductor pattern 320.

The first gate electrode 230G and the second gate electrode 330G may be formed on the gate insulating layer 640. The first gate electrode 230G, and the second gate electrode 330G may be formed of the same material in the same process.

According to the present embodiment, the horizontal width W1 of the first gate electrode 230G may be formed equal to the horizontal width W1 of the second gate electrode 330G.

Thereafter, a photoresist film PR may be formed on the first gate electrode 230G before an ion implantation process is performed. The photoresist film PR may block accelerated ions. The horizontal width W5 of the photoresist layer PR may be larger than the horizontal width W1 of the first gate electrode 230G and smaller than the horizontal width of the first semiconductor pattern 220.

Thereafter, an ion implantation process may be performed. The ion implantation process is a process of physically implanting ions formed using a source gas into a semiconductor pattern. When an electric field is applied to charged ion particles to accelerate the ion particles toward the semiconductor pattern, dopant collides with the semiconductor pattern and the ions are implanted into the semiconductor pattern. The depth at which the dopant is implanted may be controlled by adjusting acceleration energy, and the amount of dopant may be controlled by measuring an ion current.

According to the present embodiment, the photoresist film PR may be formed overlapping a portion of the upper portion of the first semiconductor pattern 220, so that dopant is implanted into a portion of the first semiconductor pattern 220 but is prevented or at least reduced a likelihood from being implanted into the remaining portion of the first semiconductor pattern 220. Accordingly, the horizontal width W5 of the first channel region 220C may be formed equal to the horizontal width W5 of the photoresist film PR. The photoresist film PR is not formed on the second semiconductor pattern 320 and is formed on the second gate electrode 330G. Therefore, dopant is implanted into the second semiconductor pattern 320. In this case, the width W1 of the second channel region 320C formed may be equal to the width W1 of the first gate electrode 330G. As a result, the horizontal width W5 of the first semiconductor region 220C may be formed larger than the horizontal width W1 of the second semiconductor region 320C.

According to the present embodiment, the horizontal width W1 of the first gate electrode 230G may be equal to the horizontal width W1 of the second gate electrode 330G. However, the horizontal width W5 of the first channel region 220C may be formed wider than the horizontal width W1 of the second channel region 320C.

According to the present embodiment, the total dose of the first semiconductor pattern 220 formed by the ion implantation process may be smaller than the total dose of the second semiconductor pattern 320. Conversely, the total dose of the second semiconductor pattern 320 may be larger than the total dose of the first semiconductor pattern 220.

The above description and accompanying drawings are merely illustrative of the technical idea of the present disclosure, and various modifications and variations, such as combination, separation, substitution and change of configurations, may be made without departing from the essential characteristics of the present disclosure by those skilled in the art to which the present disclosure pertains. Therefore, the embodiments of the present disclosure are provided for illustrative purposes only but not intended to limit the technical spirit of the present disclosure, and the scope of the technical idea of the present disclosure is not limited by these embodiments. The scope of protection of the present disclosure should be interpreted by the following claims, and all technical ideas within the scope equivalent thereto should be construed as being included in the scope of the present disclosure.

What is claimed is:

1. A display panel, comprising:
a plurality of switching transistors, each of the plurality of switching transistors including:
a first semiconductor pattern including an oxide semiconductor, and having a first dose, and
a first gate electrode; and
a driving transistor, the driving transistor including:
a second semiconductor pattern including the oxide semiconductor, and having a second dose different from the first dose, and
a second gate electrode,
wherein a first distance between the first semiconductor pattern and the first gate electrode is different from a second distance between the second semiconductor pattern and the second gate electrode.

2. The display panel of claim 1, wherein the second dose is larger than the first dose.

3. The display panel of claim 1, wherein the first distance is larger than the second distance.

4. The display panel of claim 1, wherein the first gate electrode and a channel region of the first semiconductor pattern have a same width as each other.

5. The display panel of claim 1, wherein the second gate electrode and a channel region of the second semiconductor pattern have a same width as each other.

6. The display panel of claim 1, wherein the first gate electrode and the second gate electrode have a same width as each other.

7. The display panel of claim 1, wherein the first semiconductor pattern and the second semiconductor pattern have channel regions having a same width as each other.

8. The display panel of claim 1, wherein a first distance between the first semiconductor pattern and the first gate electrode is equal to a second distance between the second semiconductor pattern and the second gate electrode.

9. The display panel of claim 8, wherein the first gate electrode and a channel region of the first semiconductor pattern have a same width, wherein the first gate electrode and a channel region of the first semiconductor pattern have the same width, wherein the first gate electrode and the second gate electrode have the same width, and wherein the channel region of the first semiconductor pattern and the channel region of the second semiconductor pattern have the same width.

10. The display panel of claim 1, wherein the first semiconductor pattern and the second semiconductor pattern are formed in a same layer as each other, the first gate electrode and the second gate electrode are formed in the same layer as each other, further comprising: a gate insulating layer disposed on the first semiconductor pattern and second semiconductor pattern.

11. The display panel of claim 10, wherein a height of the gate insulating layer at a switching transistor of the plurality of switching transistors is higher than a height of the gate insulating layer at the driving transistor.

12. The display panel of claim 10, further comprising:

an auxiliary interlayer insulating layer disposed between the first semiconductor pattern and the first gate electrode.

13. A display panel, comprising:

a plurality of switching transistors, each of the plurality of switching transistors including:

a first semiconductor pattern including an oxide semiconductor; and having a first total dose, and a first gate electrode; and a driving transistor, the driving transistor including:

a second semiconductor pattern including the oxide semiconductor, and having a second total dose different from the first total dose, and a second gate electrode, wherein a channel region of the first semiconductor pattern has a width larger than a width of a channel region of the second semiconductor pattern.

14. The display panel of claim 13, wherein the first gate electrode has a width larger than a width of the second gate electrode.

15. The display panel of claim 13, wherein the first gate electrode has a width equal to a width of the second gate electrode, wherein a channel region of the first semiconductor pattern has a width larger than a width of a channel region of the second semiconductor pattern, and wherein the channel region of the second semiconductor pattern has a width equal to a width of the second gate electrode.

16. The display panel of claim 13, wherein the first gate electrode has a width equal to a width of the second gate electrode, wherein a channel region of the first semiconductor pattern has a width larger than a width of a channel region of the second semiconductor pattern, and wherein the channel region of the first semiconductor pattern has a width larger than a width of the first gate electrode.

* * * * *